(12) United States Patent
Chiang et al.

(10) Patent No.: US 11,735,425 B2
(45) Date of Patent: Aug. 22, 2023

(54) FIN FIELD-EFFECT TRANSISTOR AND METHOD OF FORMING THE SAME

(71) Applicant: Taiwan Semiconductor Manufacturing Company, Ltd., Hsinchu (TW)

(72) Inventors: Tzu Ang Chiang, I-lan (TW); Ming-Hsi Yeh, Hsinchu (TW); Chun-Neng Lin, Hsinchu (TW); Jian-Jou Lian, Tainan (TW); Po-Yuan Wang, Hsinchu (TW); Chieh-Wei Chen, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/688,364

(22) Filed: Mar. 7, 2022

(65) Prior Publication Data

US 2022/0189776 A1 Jun. 16, 2022

Related U.S. Application Data

(63) Continuation of application No. 16/859,538, filed on Apr. 27, 2020, now Pat. No. 11,309,185.

(51) Int. Cl.
*H01L 21/28* (2006.01)
*H01L 29/78* (2006.01)
(Continued)

(52) U.S. Cl.
CPC .. *H01L 21/28132* (2013.01); *H01L 21/28088* (2013.01); *H01L 21/31111* (2013.01);
(Continued)

(58) Field of Classification Search
CPC ......... H01L 21/28132; H01L 21/28088; H01L 21/31111; H01L 29/4966; H01L 29/66545;
(Continued)

(56) References Cited

U.S. PATENT DOCUMENTS 8,143,131 B2 3/2012 Hsu et al.
10,483,373 B2 11/2019 Min
(Continued)

OTHER PUBLICATIONS

Korean Office Action issued in connection with KR Appl. Ser. No. 10-2022-0062834 dated Jan. 19, 2023 without English translation (5 pages).
(Continued)

*Primary Examiner* — Christine A Enad
(74) *Attorney, Agent, or Firm* — Foley & Lardner LLP

(57) ABSTRACT

A semiconductor device includes a semiconductor fin. The semiconductor device includes a metal gate disposed over the semiconductor fin. The semiconductor device includes a gate dielectric layer disposed between the semiconductor fin and the metal gate. The semiconductor device includes first spacers sandwiching the metal gate. The first spacers have a first top surface and the gate dielectric layer has a second top surface, and the first top surface and a first portion of the second top surface are coplanar with each other. The semiconductor device includes second spacers further sandwiching the first spacers. The second spacers have a third top surface above the first top surface and the second top surface. The semiconductor device includes a gate electrode disposed over the metal gate.

20 Claims, 22 Drawing Sheets

(51) Int. Cl.
*H01L 29/66* (2006.01)
*H01L 29/49* (2006.01)
*H01L 21/311* (2006.01)

(52) U.S. Cl.
CPC ...... *H01L 29/4966* (2013.01); *H01L 29/6656* (2013.01); *H01L 29/66545* (2013.01); *H01L 29/66795* (2013.01); *H01L 29/7851* (2013.01)

(58) Field of Classification Search
CPC ........... H01L 29/6656; H01L 29/66795; H01L 29/7851
See application file for complete search history.

(56) References Cited

U.S. PATENT DOCUMENTS

| | | |
|---|---|---|
| 10,510,851 B2 | 12/2019 | Wang et al. |
| 2010/0244153 A1* | 9/2010 | Hsu .................... H01L 29/6653 438/303 |
| 2012/0049247 A1 | 3/2012 | Lee et al. |
| 2014/0004692 A1 | 1/2014 | Wei et al. |
| 2014/0103404 A1 | 4/2014 | Li et al. |
| 2015/0118835 A1* | 4/2015 | Lin .................... H01L 29/66477 438/586 |
| 2018/0166548 A1 | 6/2018 | Huang et al. |
| 2018/0248013 A1 | 8/2018 | Chowdhury et al. |
| 2019/0035917 A1* | 1/2019 | Cheng .................... H01L 29/401 |
| 2019/0043953 A1 | 2/2019 | George et al. |
| 2019/0051730 A1* | 2/2019 | Min .................... H01L 21/0334 |

OTHER PUBLICATIONS

Taiwan Office Action issued in connection with TW Appl. Ser. No. 110114683 dated Apr. 19, 2023 without English translation (5 pages).

* cited by examiner

FIN FIELD-EFFECT TRANSISTOR AND METHOD OF FORMING THE SAME

CROSS-REFERENCE TO RELATED APPLICATION

This application is related to and claims priority under 35 U.S. § 120 as a continuation of U.S. Utility application Ser. No. 16/859,538, filed on Apr. 27, 2020, titled "FIN FIELD-EFFECT TRANSISTOR AND METHOD OF FORMING THE SAME," the entire contents of which are incorporated herein by reference for all purposes.

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
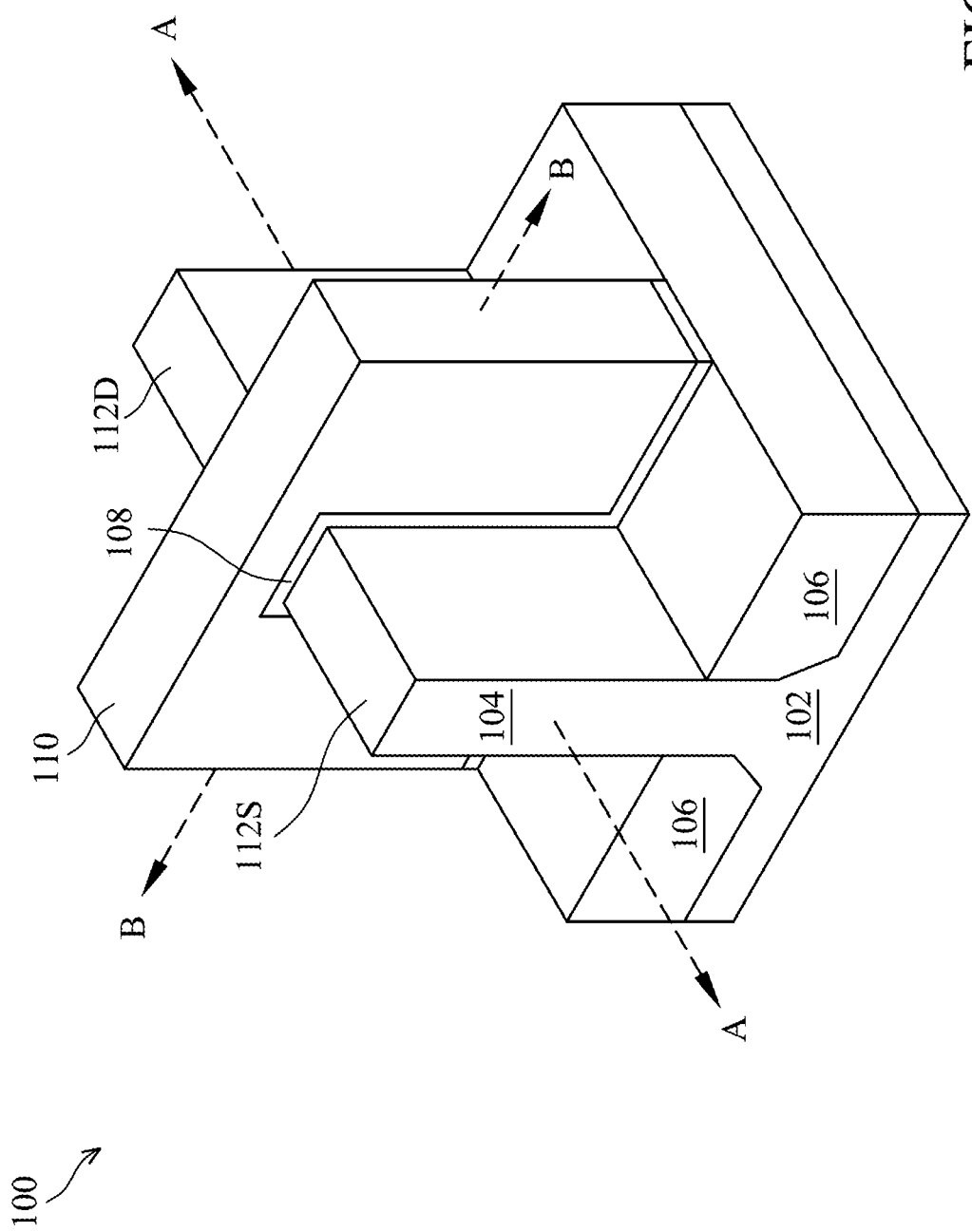
FIG. 1 illustrates a perspective view of a fin field-effect transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1, ±2%, ±3%, ±4%, ±5% of the value).

Embodiments of the present disclosure are discussed in the context of forming a FinFET device, and in particular, in the context of forming a replacement gate of a FinFET device. In some embodiments, a dummy gate structure is formed over a fin. A first gate spacer is formed around the dummy gate structure, and a second gate spacer is formed around the first gate spacer. After an interlayer dielectric (ILD) layer is formed around the second gate spacer, the dummy gate structure is removed. Next, upper portions of the first gate spacer are removed while lower portions of the first gate spacer remain. After removing the upper portions of the first gate spacer, a gate trench is formed in the ILD layer. The gate trench has a lower trench between the lower portions of the first gate spacer and has an upper trench over the lower trench, where the upper trench may be wider than the lower trench. Next, a gate dielectric layer, one or more work function layers, an optional capping layer, and a glue layer are successively formed in the gate trench. Next, the glue layer is selectively removed from the upper trench by a first wet etch process, the optional capping layer (if formed) is removed from the upper trench by a second wet etch process, and the work function layer(s) are selectively removed from the upper trench by a third wet etch process. After the third wet etch process, the gate dielectric layer remains extending along the trench. Further, a portion of the gate dielectric layer, remaining portions of the work function layer(s), a remaining portion of the capping layer, and a remaining portion of the glue layer are disposed in the lower trench. The remaining portions of the work function layer(s), the capping layer, and the glue layer can present a concave upper surface that is below an interface between the upper trench and the lower trench. Next, a gate electrode is formed in the trench to be in contact with the concave upper surface of the work function layer(s), the capping layer, and the glue layer. The gate electrode may overlay the portion of the gate dielectric layer in the lower trench, and the remaining portions of the work function layer(s), the capping layer, and the glue layer in the lower trench. Next, a fourth wet etch process is performed to remove the gate dielectric layer not overlaid by the gate electrode, while remaining the gate electrode substantially intact. In some embodiments, the remaining portions of the work function layer(s), the capping layer, and the glue layer may be collectively referred to as a metal gate.

Metal gates over a fin formed by the above described method have a lager distance (e.g., pitch) in between, thereby reducing metal gate leakage in advanced processing nodes. The various selective etch processes used in the above described method can precisely control the end point of the etching process, avoid attaching undesired metal material to the gate spacers during formation of the gate electrode, and avoid the loading effect during etch back of the various layers of the metal gates. As a result, the gate height of the metal gate is precisely controlled. In addition, the critical dimension (CD) of the metal gate and the sidewall profiles of the ILD layer and an overlying mask layer are preserved.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain regions 112D and 112S are in the fin 104 and on opposing sides of the gate dielectric 108 and the gate 110. The source/drain regions 112D and 112S extend outward from the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
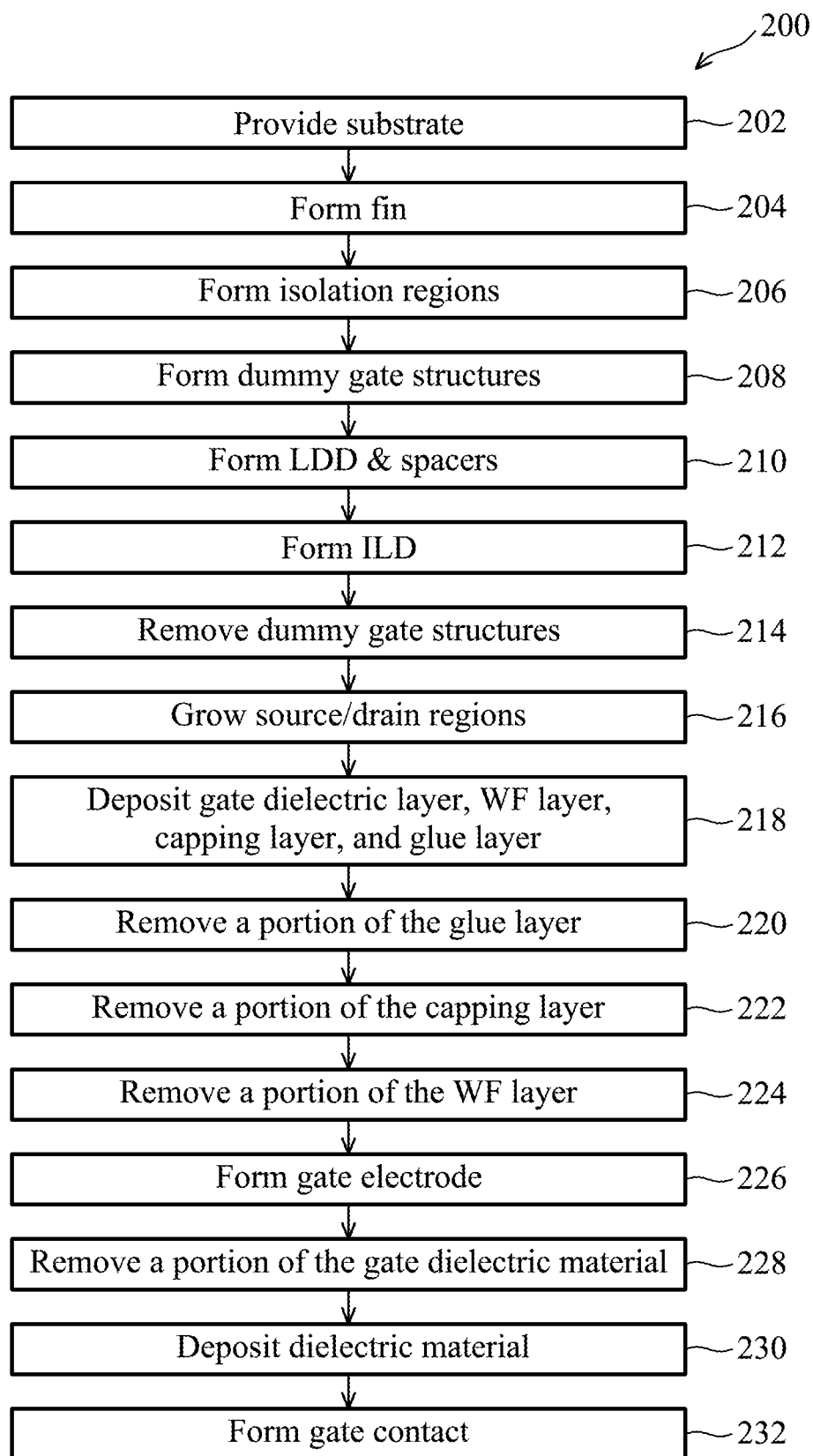
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, 16, 17, 18, and 19, respectively, which will be discussed in further detail below.

In brief overview, the method 200 starts with operation 202 of providing a substrate. The method 200 continues to operation 204 of forming a fin. The method 200 continues to operation 206 of forming isolation regions. The method 200 continues to operation 208 of forming dummy gate structures. The dummy gate structures may straddle a central portion of the fin. The method 200 continues to operation 210 of forming lightly doped drain (LDD) regions and gate spacers. The gate spacers are extended along sidewalls of the dummy gate structure. The method 200 continues to operation 212 of growing source/drain regions. The method 200 continues to operation 214 of forming an interlayer dielectric (ILD). The method 200 continues to operation 216 of removing the dummy gate structure. Upon the dummy gate structure being removed, the central portion of the fin is re-exposed. The method 200 continues to operation 218 of depositing a gate dielectric layer, a work function layer, a capping layer, and a glue layer. The method 200 continues to operation 220 of removing a portion of the glue layer. The method 200 continues to operation 222 of removing a portion of the capping layer. The method 200 continues to operation 224 of removing a portion of the work function layer. The method 200 continues to operation 226 of forming a metal structure. Such a metal structure is sometimes referred to as a gate electrode. The method 200 continues to operation 228 of removing a portion of the gate dielectric material. The method 200 continues to operation 230 of depositing a dielectric material. The method 200 continues to operation 232 of forming a gate contact.

As mentioned above, FIGS. 3-19 each illustrates, in a cross-sectional view, a portion of a FinFET device 300 at various fabrication stages of the method 200 of FIG. 2. The FinFET device 300 is substantially similar to the FinFET device 100 shown in FIG. 1, but with multiple gate structures. For example, FIGS. 3-6 illustrate cross-sectional views of the FinFET device 300 along cross-section B-B (as indicated in FIG. 1); and FIG. 7-19 illustrate cross-sectional views of the FinFET device 300 along cross-section A-A (as indicated in FIG. 1). Although FIGS. 3-19 illustrate the FinFET device 300, it is understood the FinFET device 300 may include a number of other devices such as inductors, fuses, capacitors, coils, etc., which are not shown in FIGS. 3-19, for purposes of clarity of illustration.

Figure 3:
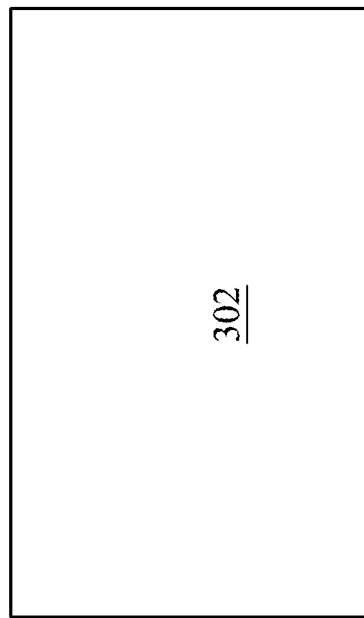
FIGS. 3, 4, 5, 6, 7, 8, 9, 10, 11, 12, 13, 14, 15, 16, 17, 18, 19, and 20 illustrate cross-sectional views of an example FinFET device (or a portion of the example FinFET device) during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
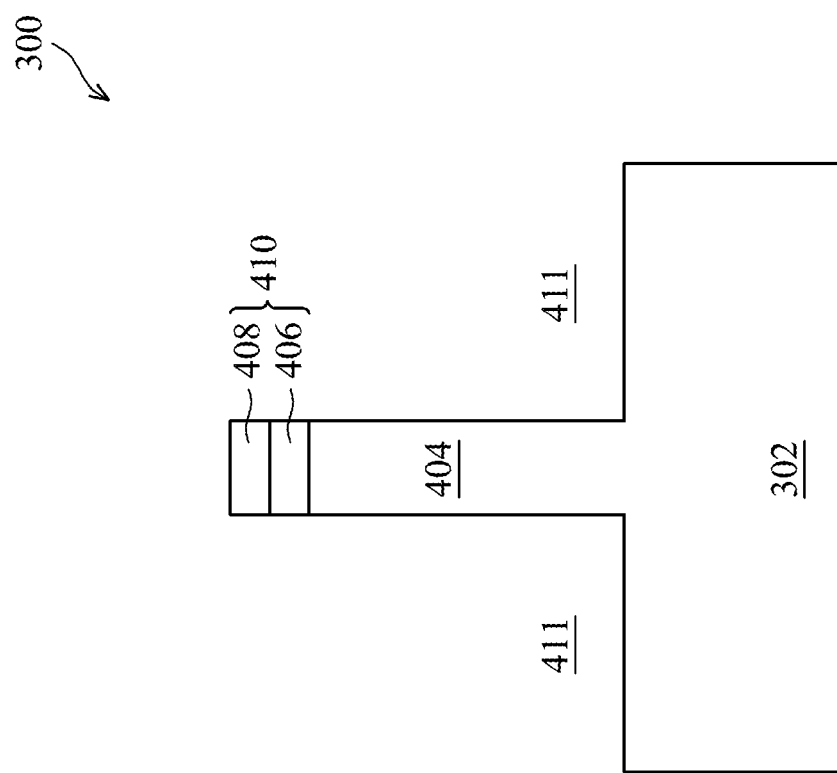

Corresponding to operation 204 of FIG. 2, FIG. 4 is a cross-sectional view of the FinFET device 300 including a (semiconductor) fin 404 at one of the various stages of fabrication. Although one fin is shown in the illustrated embodiment of FIG. 4 (and the following figures), it should be appreciated that the FinFET device 300 can include any number of fins while remaining within the scope of the present disclosure. In some embodiments, the fin 404 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining a fin 404 between adjacent trenches 411 as illustrated in FIG. 4. When multiple fins are formed, such a trench may be disposed between any adjacent ones of the fins. In some embodiments, the fin 404 is formed by etching trenches in the substrate 302 using, for example, reactive ion etch (RIE), neutral beam etch (NBE), the like, or combinations thereof. The etching may be anisotropic. In some embodiments, the trenches 411 may be strips (viewed from the top) parallel to each other, and closely spaced with respect to each other. In some embodiments, the trenches 411 may be continuous and surround the fin 404. The fin 404 may also be referred to as fin 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
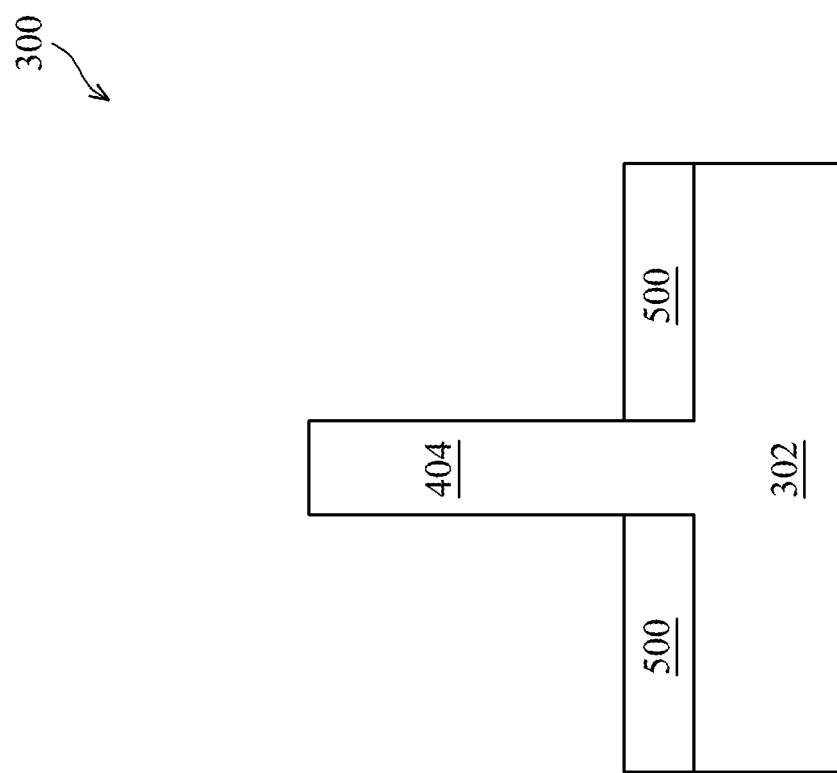

Corresponding to operation 206 of FIG. 2, FIG. 5 is a cross-sectional view of the FinFET device 300 including isolation regions 500 at one of the various stages of fabrication. The isolation regions 500, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown, the isolation regions 500 will be recessed as shown in FIG. 5). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more fins (such as fin 404), but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
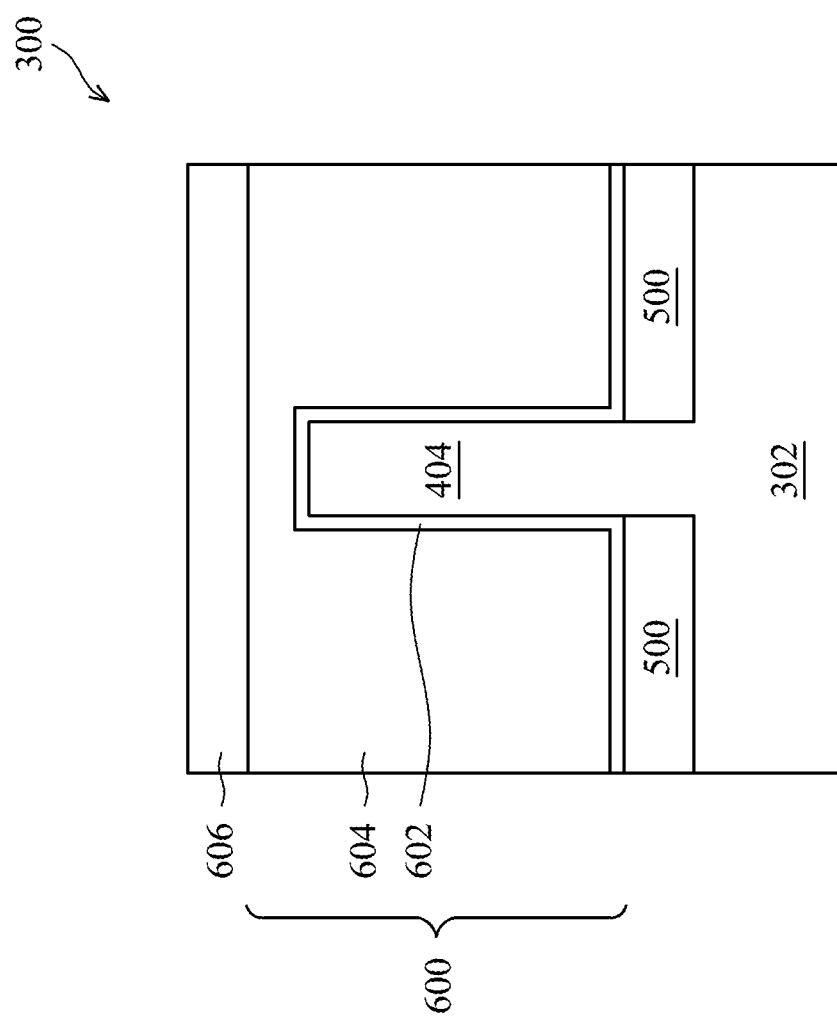

Corresponding to operation 208 of FIG. 2, FIG. 6 is a cross-sectional view of the FinFET device 300 including a dummy gate structure 600 at one of the various stages of fabrication. The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a central portion (e.g., a channel region) of the fin 404. The dummy gate 604 may also have a lengthwise direction (e.g., direction B-B of FIG. 1) substantially perpendicular to the lengthwise direction (e.g., direction of A-A of FIG. 1) of the fin 404.

The dummy gate dielectric 602 is shown to be formed over the fin 404 (e.g., over top surfaces and sidewalls of the fin 404) and over the STI regions 500 in the example of FIG. 6. In other embodiments, the dummy gate dielectric 602 may be formed by, e.g., thermal oxidization of a material of the fin 404, and therefore, may be formed over the fin 404 but not over the STI regions 500. It should be appreciated that these and other variations are still included within the scope of the present disclosure.

FIGS. 7-19 illustrate the cross-sectional views of further processing (or making) of the FinFET device 300 along cross-section A-A (along a longitudinal axis of the fin 64), as shown in FIG. 1. In brief overview, three dummy gate structures 600A, 600B, and 600C are illustrated over the fin 404 in the examples of FIGS. 7-11. For simplicity, the dummy gate structures 600A, 600B, and 600C may sometimes be collectively referred to as dummy gate structures 600. It should be appreciated that more or less than three dummy gate structures can be formed over the fin 404, while remaining within the scope of the present disclosure.

Figure 7:
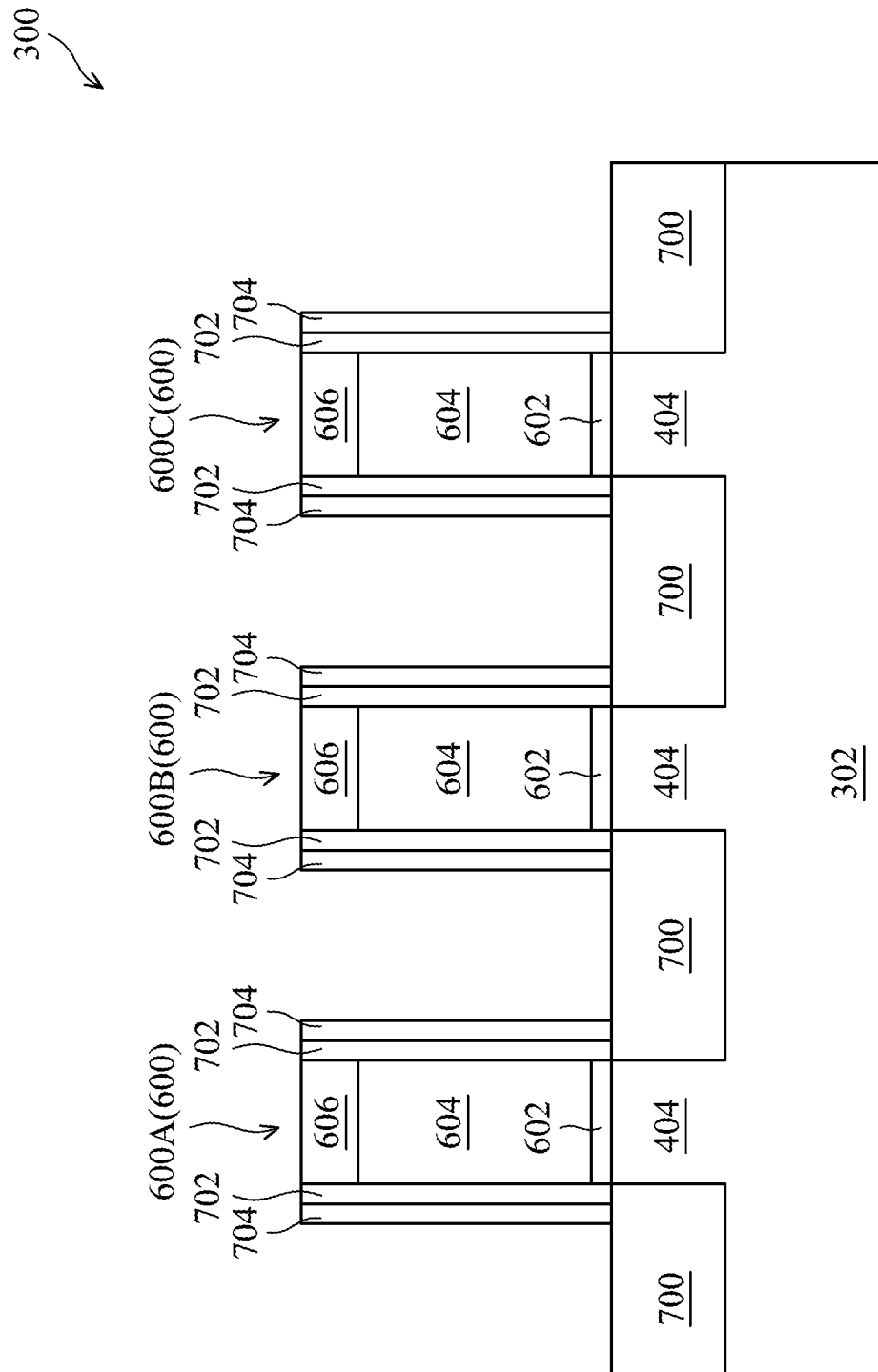

Corresponding to operation 210 of FIG. 2, FIG. 7 is a cross-sectional view of the FinFET device 300 including a number of lightly doped drain (LDD) regions 700 formed in the fin 404 at one of the various stages of fabrication. The LDD regions 700 may be formed by a plasma doping process. The plasma doping process may include forming and patterning masks such as a photoresist to cover the regions of the FinFET device 300 that are to be protected from the plasma doping process. The plasma doping process may implant N-type or P-type impurities in the fin 404 to form the LDD regions 700. For example, P-type impurities, such as boron, may be implanted in the fin 404 to form the LDD regions 700 for a P-type device. In another example, N-type impurities, such as phosphorus, may be implanted in the fin 404 to form the LDD regions 700 for an N-type device. In some embodiments, the LDD regions 700 abut one of the channel regions of the FinFET device 300 (e.g., the central portion of the fin 404 overlaid by one of the dummy structures 600). Portions of the LDD regions 700 may extend under the dummy gate structure 600 and into the channel region of the FinFET device 300. FIG. 7 illustrates a non-limiting example of the LDD regions 700. Other configurations, shapes, and formation methods of the LDD regions 700 are also possible and are fully intended to be included within the scope of the present disclosure. For example, the LDD regions 700 may be formed after gate spacers 702/704, which will be discussed below, are formed. In some embodiments, the LDD regions 700 are omitted.

Still referring to FIG. 7, after the LDD regions 700 are formed, in some embodiments, first gate spacers 702 are formed around (e.g., along and contacting the sidewalls of) the dummy gate structures 600, and second gate spacers 704 are formed around (e.g., along and contacting the sidewalls of) the first gate spacers 702. For example, the first gate spacer 702 may be formed on opposing sidewalls of the dummy gate structure 600. The second gate spacer 704 may be formed on the first gate spacer 702. It should be understood that any number of gate spacers can be formed around the dummy gate structures 600 while remaining within the scope of the present disclosure.

The first gate spacer 702 may be a low-k spacer and may be formed of a suitable dielectric material, such as silicon oxide, silicon oxycarbonitride, or the like. The second gate spacer 704 may be formed of a nitride, such as silicon nitride, silicon oxynitride, silicon carbonitride, the like, or combinations thereof. Any suitable deposition method, such as thermal oxidation, chemical vapor deposition (CVD), or the like, may be used to form the first gate spacer 702 and the second gate spacer 704. In accordance with various embodiments, the first gate spacer 702 and the second gate spacer 704 are formed of different materials to provide etching selectivity in subsequent processing. The first gate spacer 702 and the second gate spacer 704 may sometimes be collectively referred to as gate spacers 702/704.

The shapes and formation methods of the gate spacers 702-704 as illustrated in FIG. 7 (and the following figures) are merely non-limiting examples, and other shapes and formation methods are possible. These and other variations are fully intended to be included within the scope of the present disclosure.

Figure 8:
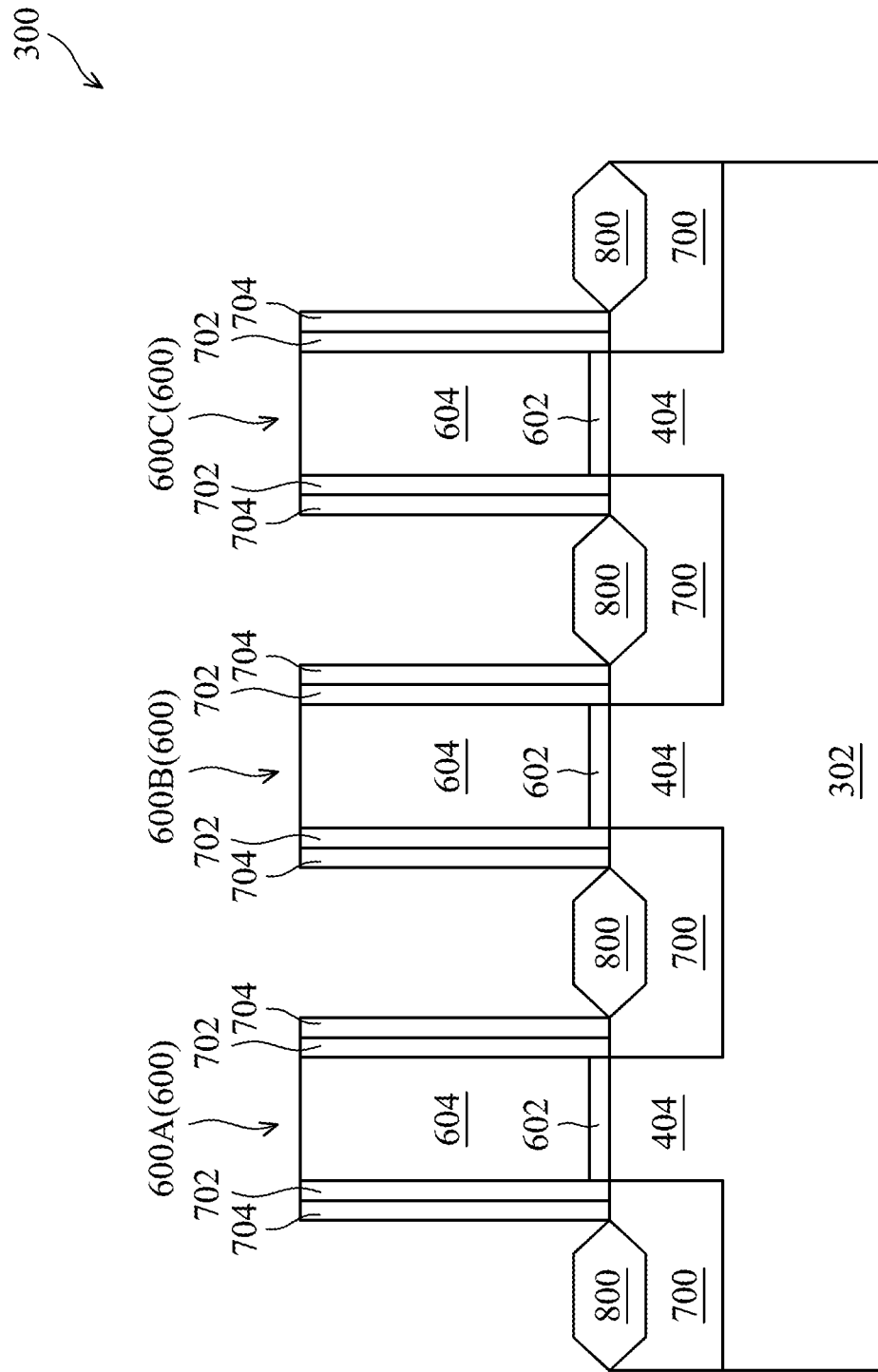

Corresponding to operation 212 of FIG. 2, FIG. 8 is a cross-sectional view of the FinFET device 300 including a number of source/drain regions 800 at one of the various stages of fabrication. The source/drain regions 800 are formed in recesses of the fin 404 adjacent to the dummy gate structures 600. For example, the source/drain regions 800 and the dummy gate structures 600 are alternately arranged. In other words, one source/drain region 800 is sandwiched between adjacent dummy gate structures 600 and/or merely one side of the source/drain region 800 is disposed next to a dummy gate structure 600. The recesses are formed by, e.g., an anisotropic etching process using the dummy gate structures 600 as an etching mask, in some embodiments, although any other suitable etching process may also be used.

The source/drain regions 800 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 800 may have surfaces raised from respective surfaces of the fin 404 (e.g. raised above the non-recessed portions of the fin 404) and may have facets. In some embodiments, the source/drain regions 800 of the adjacent fins may merge to form a continuous epitaxial source/drain region (not shown). In some embodiments, the source/drain regions 800 of the adjacent fins may not merge together and remain separate source/drain regions 800 (not shown). In some embodiments, when the resulting FinFET device is an n-type FinFET, the source/drain regions 800 can include silicon carbide (SiC), silicon phosphorous (SiP), phosphorous-doped silicon carbon (SiCP), or the like. In some embodiments, when the resulting FinFET device is a p-type FinFET, the source/drain regions 800 comprise SiGe, and a p-type impurity such as boron or indium.

The epitaxial source/drain regions 800 may be implanted with dopants to form source/drain regions 800 followed by an annealing process. The implanting process may include forming and patterning masks such as a photoresist to cover the regions of the FinFET device 300 that are to be protected from the implanting process. The source/drain regions 800 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain region 800 of a P-type transistor. N-type impurities, such as phosphorous or arsenide, may be implanted in the source/drain regions 800 of an N-type transistor. In some embodiments, the epitaxial source/drain regions 800 may be in situ doped during their growth.

Figure 9:
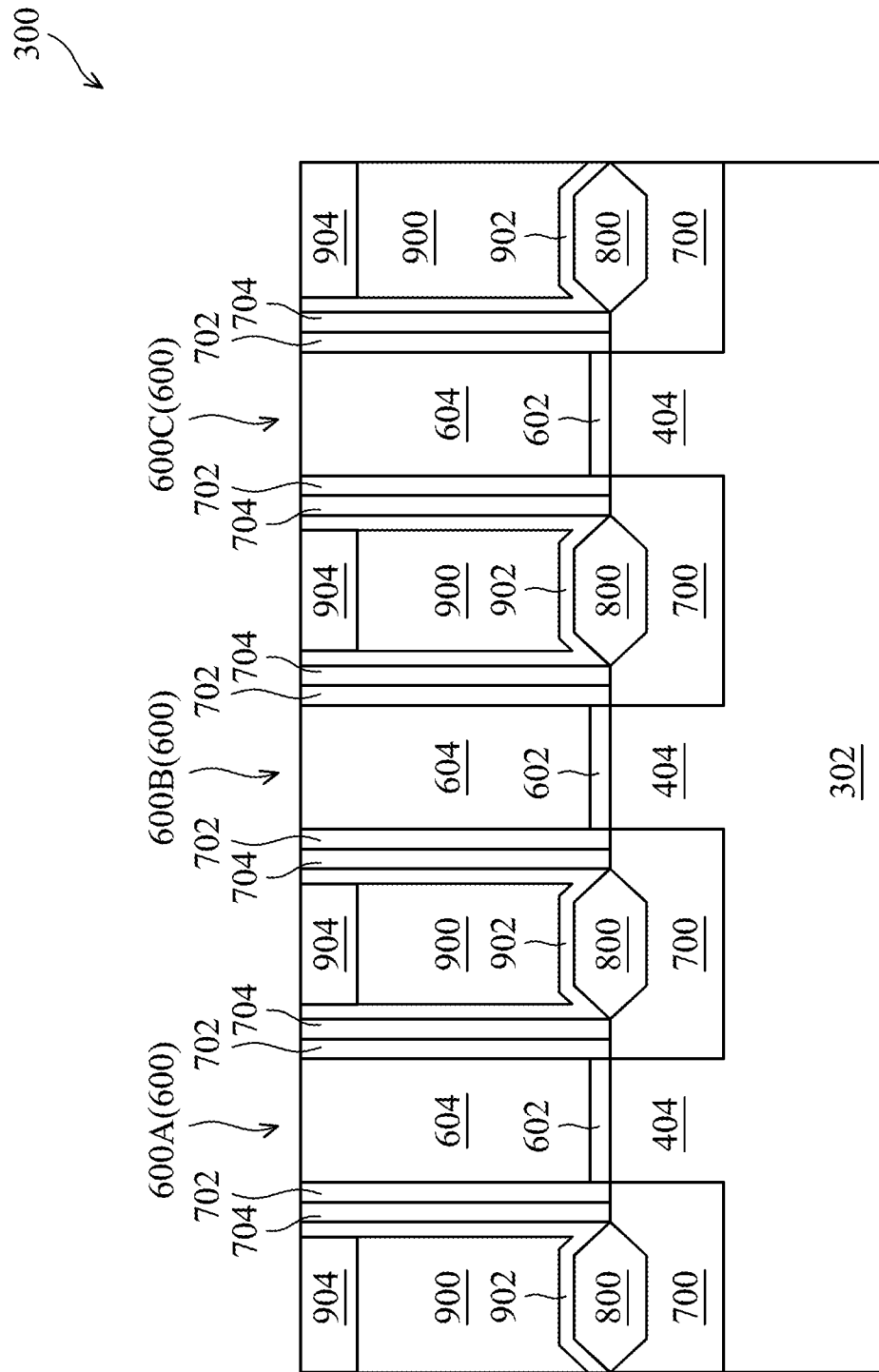

Corresponding to operation 214 of FIG. 2, FIG. 9 is a cross-sectional view of the FinFET device 300 including an interlayer dielectric (ILD) 900 at one of the various stages of fabrication. In some embodiments, prior to forming the ILD 900, a contact etch stop layer (CESL) 902 is formed over the structure illustrated in FIG. 9. The CESL 902 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 900 is formed over the CESL 902 and over the dummy gate structures 600 (e.g., 600A, 600B, and 600C). In some embodiments, the ILD 900 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 900 is formed, a dielectric layer 904 is formed over the ILD 900. The dielectric layer 904 can function as a protection layer to prevent or reduces the loss of the ILD 900 in subsequent etching processes. The dielectric layer 904 may be formed of a suitable material, such as silicon nitride, silicon carbonitride, or the like, using a suitable method such as CVD, PECVD, or FCVD. After the dielectric layer 904 is formed, a planarization process, such as a CMP process, may be performed to achieve a level upper surface for the dielectric layer 904. The CMP may also remove the mask 606 and portions of the CESL 902 disposed over the dummy gate 604. After the planarization process, the upper surface of the dielectric layer 904 is level with the upper surface of the dummy gate 604, in some embodiments.

An example gate-last process (sometimes referred to as replacement gate process) is performed subsequently to replace the dummy gate 604 and the dummy gate dielectric 602 of each of the dummy gate structures 600 with an active gate (which may also be referred to as a replacement gate or a metal gate).

Figure 10:
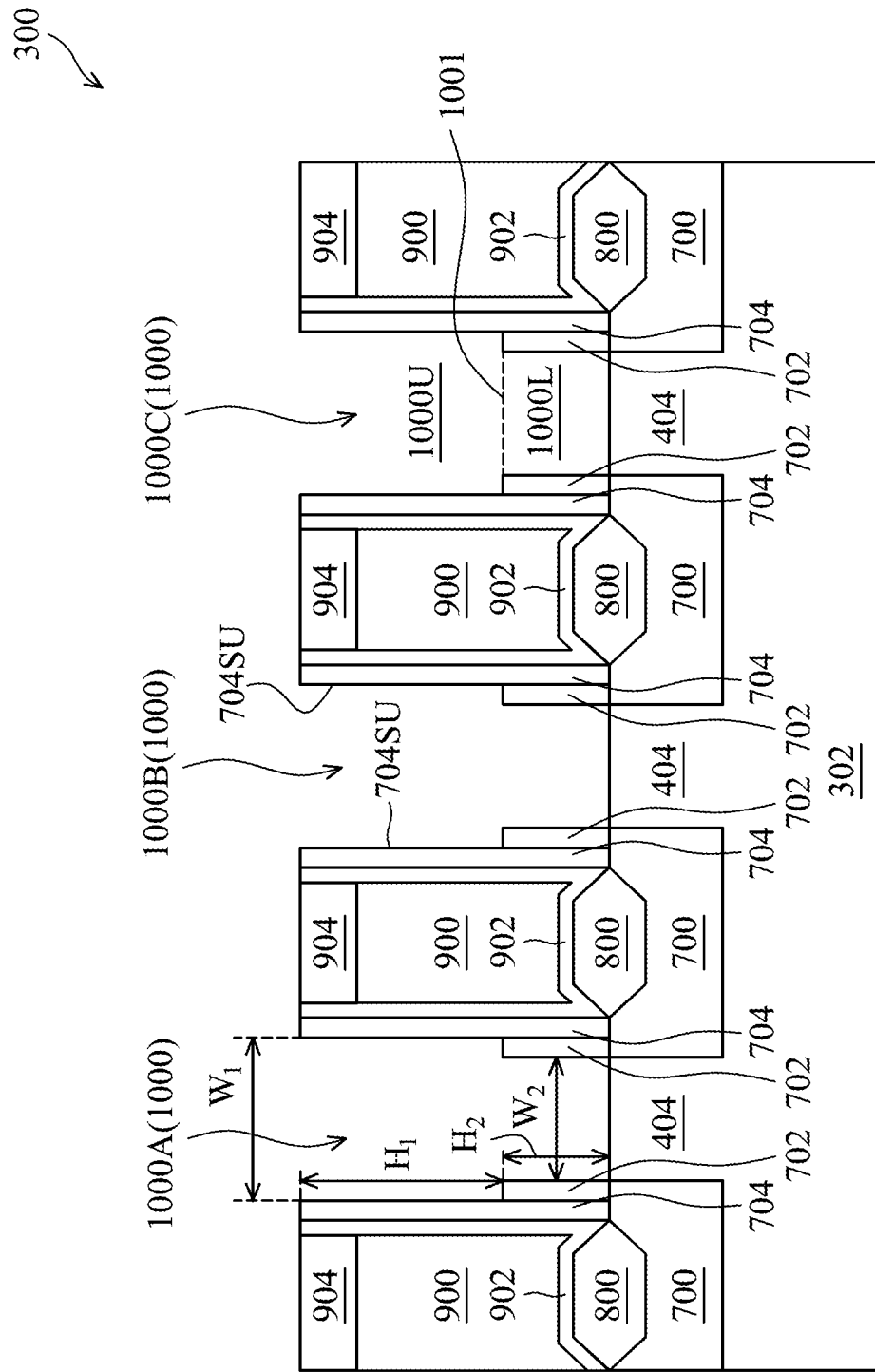

Corresponding to operation 216 of FIG. 2, FIG. 10 is a cross-sectional view of the FinFET device 300 in which the dummy gate structures 600A, 600B, and 600C (FIG. 9) are removed to form gate trenches 1000A, 1000B, and 1000C, respectively, at one of the various stages of fabrication. Next, upper portions of the gate trenches 1000A, 1000B, and 1000C are horizontally expanded by removing relative upper portions of the first gate spacers 702, such that each of the gate trenches 1000A, 1000B, and 1000C has an upper trench 1000U and a lower trench 1000L, where the upper trench 1000U is wider than the lower trench 1000L horizontally. Details of forming the gate trenches 1000A-C will be discussed below. For simplicity, the gate trenches 1000A-C may sometimes be collectively referred to as gate trenches 1000.

In some embodiments, to remove the dummy gate structures 600, one or more etching steps are performed to remove the dummy gate 604 and the dummy gate dielectric 602 directly under the dummy gate 604, so that the gate trenches 1000 (which may also be referred to as recesses) are formed between respective first gate spacers 702. Each gate trench 1000 exposes the channel region of the fin 404. During the dummy gate removal, the dummy gate dielectric 602 may be used as an etch stop layer when the dummy gate 604 is etched. The dummy gate dielectric 602 may then be removed after the removal of the dummy gate 604.

Next, an anisotropic etching process, such as a dry etch process, is performed to remove upper portions of the first gate spacer 702. In some embodiments, the anisotropic etching process is performed using an etchant that is selective to (e.g., having a higher etching rate for) the material of the first gate spacer 702, such that the first gate spacer 702 is recessed (e.g., upper portions removed) without substantially attacking the second gate spacer 704 and the dielectric layer 904. After the upper portions of the first gate spacers 702 are removed, upper sidewalls 704SU of the second gate spacer 704 are exposed.

As illustrated in FIG. 10, after the upper portions of the first gate spacers 702 are removed, each of the gate trenches 1000 has an upper trench 1000U and a lower trench 1000L. The lower trench 1000L is between the remaining lower portions of the first gate spacer 702. The upper trench 1000U is over the lower trench 1000, and is defined (e.g., bordered) by the upper sidewalls 704SU of the second gate spacer 704. FIG. 10 illustrates an interface 1001 between the upper trench 1000U and the lower trench 1000L. The interface 1001 is level with an upper surface 1000U of the remaining lower portions of the first gate spacer 702. Each of the gate trenches 1000 has a wider upper trench 1000U and a narrow lower trench 1000L, which resembles the letter "Y," and therefore, the gate trenches 1000 may sometimes be referred to as Y-shaped gate trenches.

In some embodiments, the upper trench 1000U has a width $W_1$ (e.g., a distance between respective opposing upper sidewalls 704SU) between about 20 nanometers (nm) and about 30 nm, and has a depth $H_1$ (e.g., a distance between an upper surface of the second gate spacer 704 and the interface 1001) between about 20 nm and about 120 nm. The lower trench 1000L has a width $W_2$ (e.g., a distance between respective opposing sidewalls of the remaining lower portions of the first gate spacer 702) between about 10 nm and about 20 nm, and has a depth $H_2$ (e.g., a distance between a bottom surface of the gate trench 1000 and the interface 1001) between about 20 nm and about 40 nm. As will be described in subsequent processing, metal gates (see, e.g., 1520 of FIG. 15) are formed in the lower trenches 1000L. For example, a gate electrode material (see, e.g., 1600 of FIG. 16), such as tungsten, is used to fill the lower trenches 1000L to form the gate electrode of the metal gates. Therefore, the size of the lower trench 1000L can determine the size of the metal gates and the size of the gate electrodes.

Figure 11:
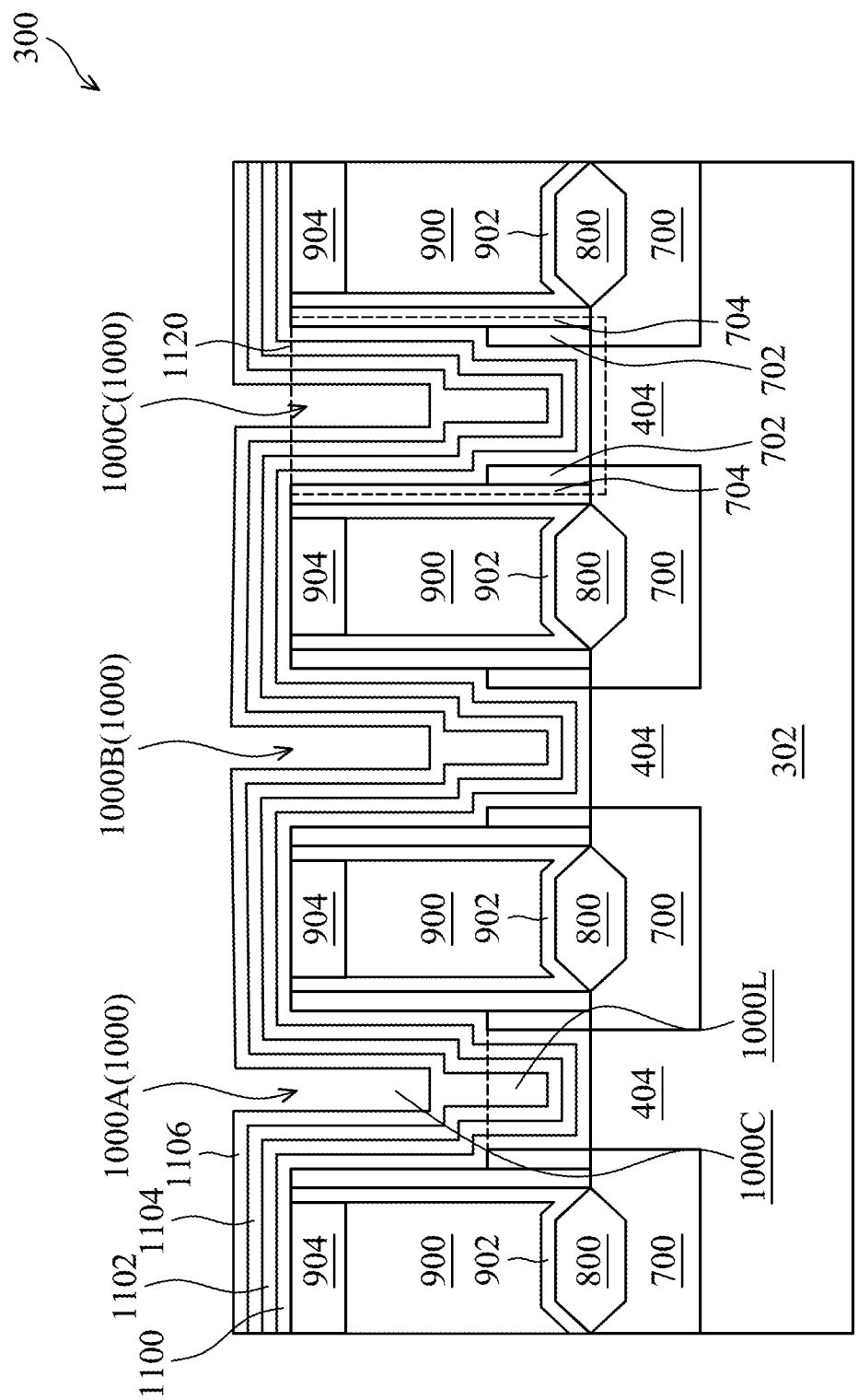

Corresponding to operation 218 of FIG. 2, FIG. 11 is a cross-sectional view of the FinFET device 300 including a gate dielectric layer 1100, a work function layer 1102, an optional capping layer 1104, and a glue layer 1106 at one of the various stages of fabrication. The gate dielectric layer 1100, the work function layer 1102, the optional capping layer 1104, and the glue layer 1106 are formed successively in the gate trenches 1000.

For example, the gate dielectric layer 1100 is deposited conformally in the gate trenches 1000, such as on the top surfaces and the sidewalls of the fin 404, on the top surfaces and the sidewalls of the gate spacers 702/704, and on the top surface of the dielectric layer 904. In accordance with some embodiments, the gate dielectric layer 1100 includes silicon oxide, silicon nitride, or multilayers thereof. In example embodiments, the gate dielectric layer 1100 includes a high-k dielectric material, and in these embodiments, the gate dielectric layers 1100 may have a k value greater than about 7.0, and may include a metal oxide or a silicate of Hf, Al, Zr, La, Mg, Ba, Ti, Pb, and combinations thereof. The formation methods of gate dielectric layer 1100 may include molecular beam deposition (MBD), atomic layer deposition (ALD), PECVD, and the like. A thickness of the gate dielectric layer 1100 may be between about 8 angstroms (Å) and about 20 angstroms, as an example. A thickness of the gate dielectric layer 1100 may be between about 5 nanometer (nm) and about 25 nm, as another example.

Next, the work function layers 1102 is formed (e.g., conformally) over the gate dielectric layer 1100. The work function layer 1102 may be a P-type work function layer, an N-type work function layer, multi-layers thereof, or combinations thereof, in some embodiments. In the illustrated example of FIG. 11, the work function layer 1102 is an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. A thickness of a P-type work function layer may be between about 8 Å and about 15 Å, and a thickness of an N-type work function layer may be between about 15 Å and about 30 Å, as an example. A thickness of a P-type work function layer may be between about 5 nanometer (nm) and about 25 nm, and a thickness of an N-type work function layer may be between about 5 nm and about 25 nm, as another example.

Next, the capping layer 1104, which is optional, is formed (e.g., conformally) over the work function layer 1102. The capping layer 1104, if formed, protects the underlying work function layer 1102 from being oxidized. In some embodiments, the capping layer 1104 is a silicon-containing layer, such as a layer of silicon, a layer of silicon oxide, or a layer of silicon nitride formed by a suitable method such as ALD, MBD, CVD, or the like. A thickness of the capping layer 1104 may be between about 8 Å and about 15 Å, as an example. A thickness of the capping layer 1104 may be between about 5 nanometer (nm) and about 25 nm, as another example. In some embodiments, the capping layer 1104 can be omitted.

Next, the glue layer 1106 is formed (e.g., conformally) over the capping layer 1104, or over the work function layer 1102 if the capping layer 1104 is omitted. The glue layer 1106 functions as an adhesion layer between the underlying layer (e.g., 1104) and a subsequently formed gate electrode material over the glue layer 1106. The glue layer 1106 may be formed of a suitable material, such as titanium nitride, using a suitable deposition method such as CVD, PVD, ALD, or the like. A thickness of the glue layer 1106 may be between about 5 nanometer (nm) and about 25 nm, as an example. Depending on the width $W_2$ of the lower trench 1000L and the thicknesses of the previously formed layers (e.g., 1000, 1002, 1004) in the gate trenches, the glue layer 1106 may fill the remaining portions of the lower trench 1000L, as illustrated in the example of FIG. 11. Further, depending on the width $W_1$ of the upper trench 1000U, the width $W_2$ of the lower trench 1000L, and the thicknesses of the previously formed layers (e.g., 1000, 1002, 1004) in the gate trenches, the glue layer 1106 may fill the whole trench 1000.

Figure 12:
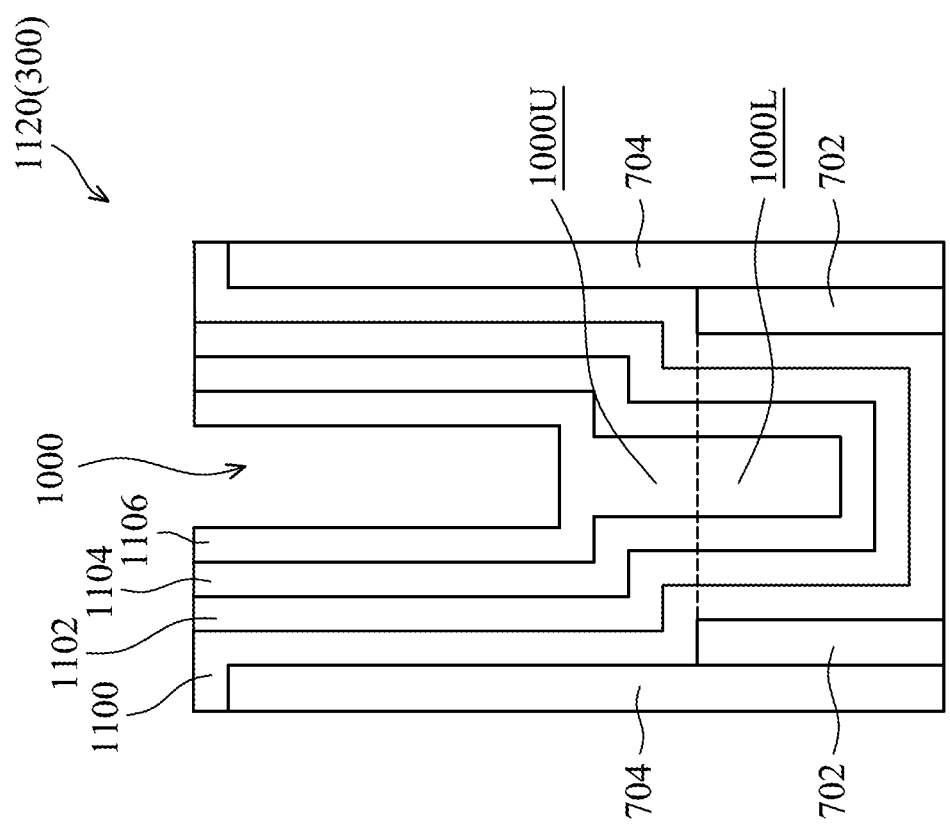

FIGS. 12-19 illustrate subsequent processing operations to form the metal gates of the FinFET device 300. For simplicity, FIGS. 12-19 each illustrate only a portion of the FinFET device 300. In particular, FIG. 12-19 each illustrate a zoomed-in (enlarged) view of a region 1120 in FIG. 11. For example, FIG. 12 shows the region 1120 of FIG. 11 upon the glue layer 1109 being formed.

Figure 13:
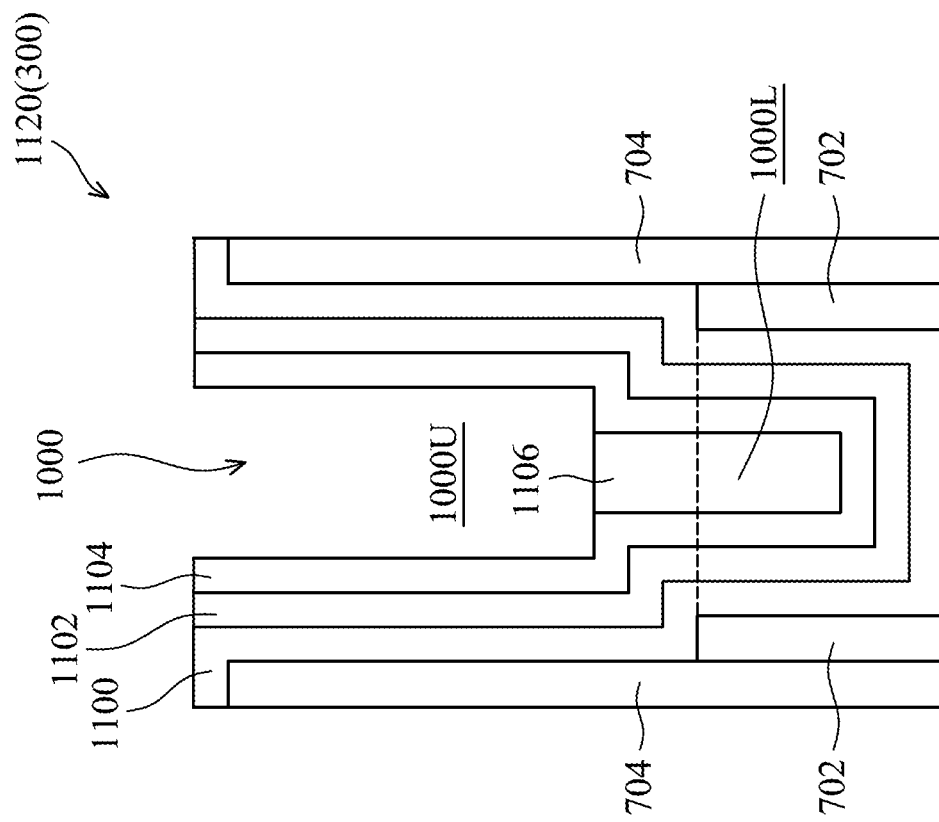

Corresponding to operation 220 of FIG. 2, FIG. 13 is a cross-sectional view of the region 1120 of the FinFET device 300 in which a portion of the glue layer 1106 is removed at one of the various stages of fabrication. In some embodiments, the portion of the glue layer 1106 is removed from the upper trench 1000U of the gate trench 1000 by a glue layer pull-back process. In some embodiments, a wet etch process is performed as the glue layer pull-back process to selectively remove the glue layer 1106 from the upper trench 1000U without attacking (e.g., damaging, removing) the underlying layer (e.g., the capping layer 1104). The wet etch process may be end-pointed on the capping layer 1104. The wet etch process is performed using a chemical including an acid and an oxidizer, in some embodiments. For example, the chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etch process may be performed at a temperature between about 40° C. and about 70° C. for a duration between about 1 minute and about 5 minutes, or else may be ended using an endpoint detection process.

As illustrated in FIG. 13, after the glue layer pull-back process, at least a portion of the capping layer 1104 is exposed in the upper trench 1000U, and a remaining portion of the glue layer 1106 still fills the lower trench 1000L.

Figure 14:
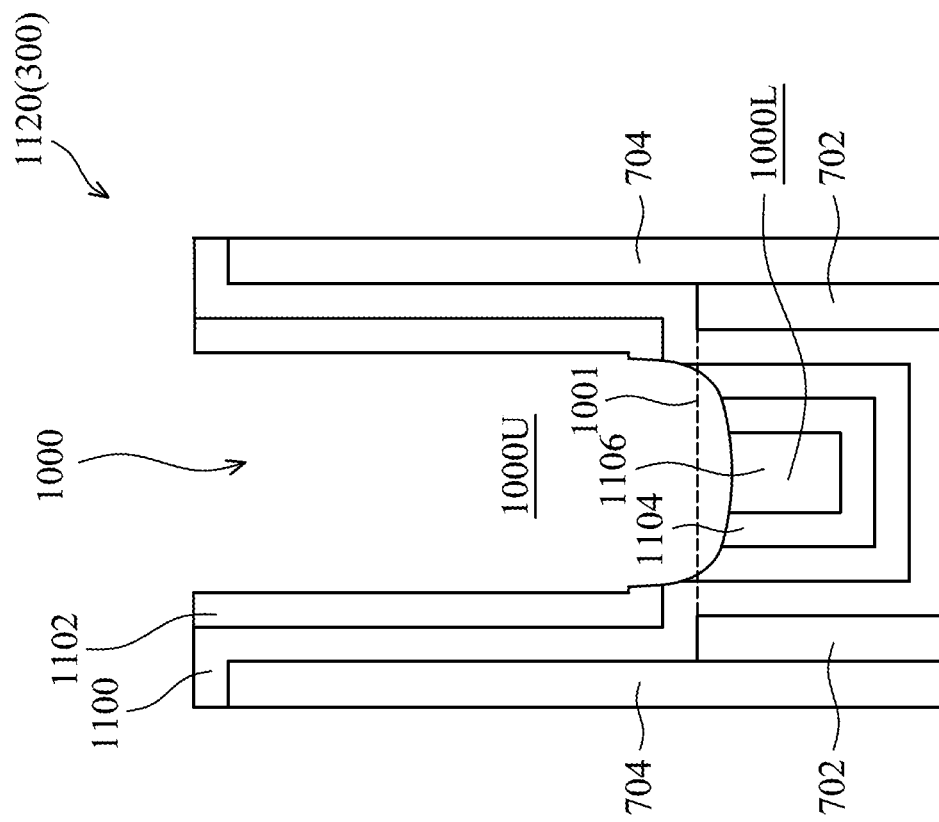

Corresponding to operation 222 of FIG. 2, FIG. 14 is a cross-sectional view of the region 1120 of the FinFET device 300 in which a portion of the capping layer 1104 is removed at one of the various stages of fabrication. In some embodiments, the portion of the capping layer 1104 is removed from the upper trench 1000U by a capping layer breakthrough process. In some embodiments, a wet etch process is performed as the capping layer break-through process to remove the capping layer 1104 from the upper trench 1000U. In some embodiments, the wet etch process to remove the capping layer 1104 from the upper trench 1000U is performed using a fluoride-containing chemical. For example, the fluoride-containing chemical may be a mixture of hydrofluoric acid (HF) and water (e.g., $H_2O$, or de-ionized water (DIW)). In some embodiments, a mixing ratio (e.g., volume ratio) between HF and $H_2O$ is between about 1:100 and 1:2000 for the wet etch process. The wet etch process may be performed at a temperature between about 20° C. and about 40° C. for a duration between about 3 minutes and about 6 minutes. As illustrated in FIG. 14, after the capping layer break-through process, the work function layer 1102 is exposed in the upper trench 1000U. In some embodiments, the etching selectivity of the fluoride-containing chemical may not be high, and therefore, the wet etch process (the capping layer break-through process) is performed in a time mode. In other words, the wet etch process is timed (e.g., performed for a pre-determined period of time) so that the capping layer 1104 in the upper trench is removed without substantially attacking the work function layer 1102 and/or the gate dielectric layer 1100.

As illustrated in FIG. 14, the capping layer break-through process also recesses respective portions of the layers 1102, 1104, and 1106 in the lower trench 1000L. As such, the layers 1102, 1104, and 1106 in the lower trench can present a curved (e.g., concave) upper surface that extends below the interface 1001 between the upper trench 1000U and the lower trench 1000L.

Figure 15:
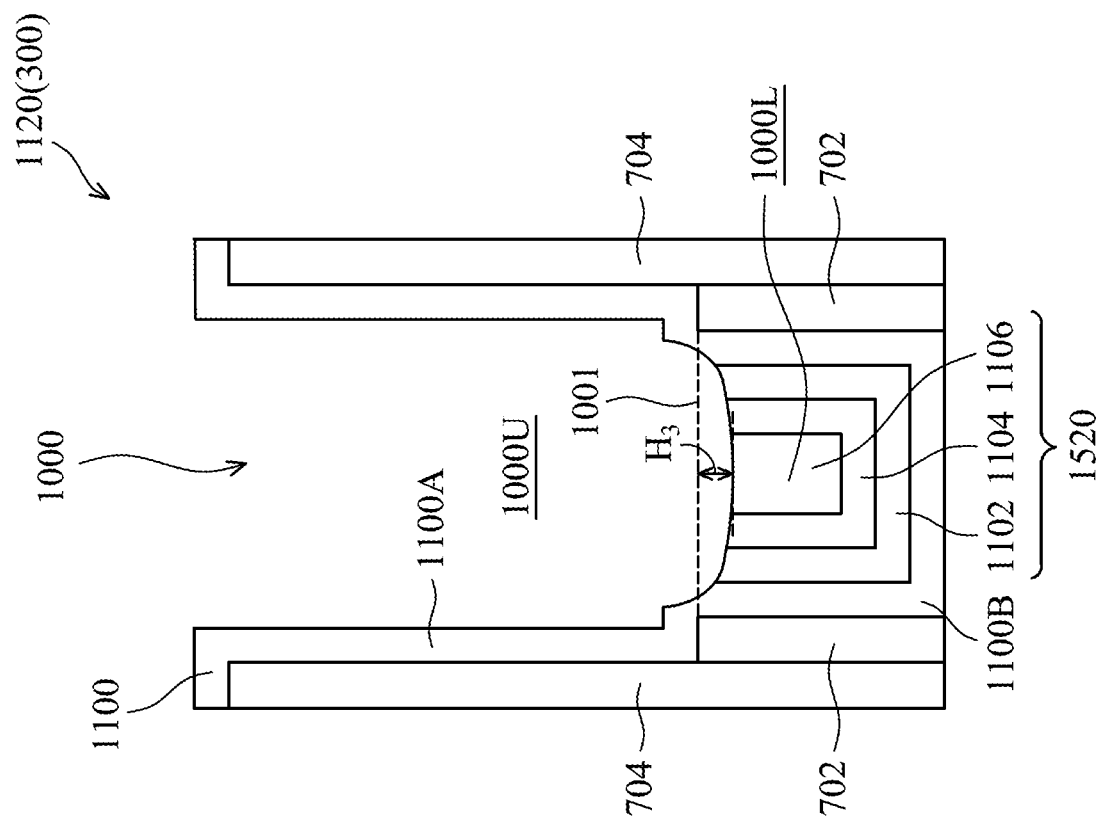

Corresponding to operation 224 of FIG. 2, FIG. 15 is a cross-sectional view of the region 1120 of the FinFET device 300 in which a portion of the work function layer 1102 is removed at one of the various stages of fabrication. In some embodiments, the portion of the work function layer 1102 is removed from the upper trench 1000U. In some embodiments, a wet etch process is performed to selectively remove the work function layer 1102 from the upper trench 1000U without attacking the underlying gate dielectric layer 1100. The wet etch process is performed using a chemical comprising a base and an oxidizer, in some embodiments. For example, the chemical used may be a mixture of ammonium hydroxide ($NH_4OH$) and hydrogen peroxide ($H_2O_2$), where $NH_4OH$ functions as the base and $H_2O_2$ functions as the oxidizer. In some embodiments, a mixing ratio (e.g., volume ratio) between $NH_4OH$ and $H_2O_2$ is between about 1:1 and 1:2001 for the wet etch process. The wet etch process may be performed at a temperature between about 40° C. and about 70° C. for a duration between about 1 minute and about 5 minutes, or else may be ended using an endpoint detection process.

As illustrated in FIG. 15, after the wet etch process, a first portion 1100A of the gate dielectric layer 1100 is exposed in the upper trench 1000U, and a second portion 1100B of the gate dielectric layer 1100 is overlaid by (or in contact with) the layers 1102, 1104, and 1106 in the lower trench 1000L. FIG. 15 also illustrates a height $H_3$ measured between a lowest position (e.g., closest to the substrate 302) of the curved upper surface of the layers 1102, 1104, and 1106 in the lower trench and the interface 1001 between the upper trench 1000U and the lower trench 1000L. In some embodiments, $H_3$ is between about 3 nm and about 12 nm. In some embodiments, the remaining portions of the various layers in the lower trench 1000L, such as the work function layer 1102, the capping layer 1104, and the glue layer 1106 can at least partially form a metal gate 1520. Accordingly, the upper surface of the metal gate 1520 may extends below the upper surface of the first gate spacer 702 by $H_3$.

Figure 16:
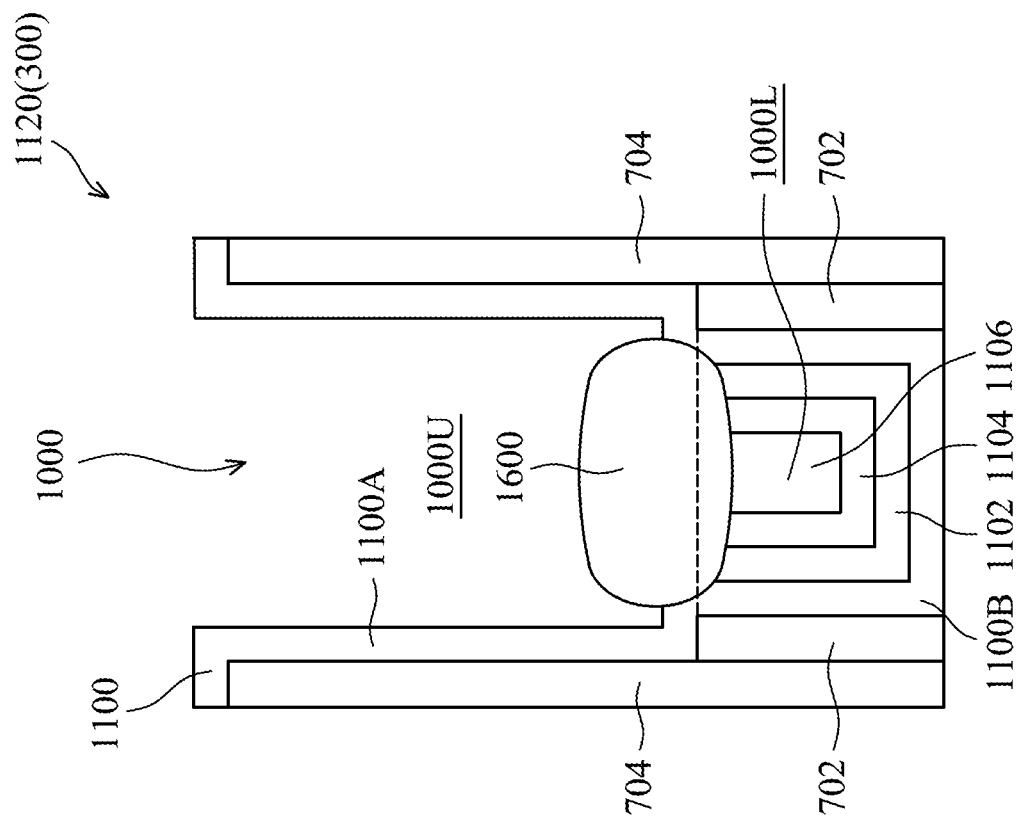

Corresponding to operation 226 of FIG. 2, FIG. 16 is a cross-sectional view of the region 1120 of the FinFET device 300 in which a metal structure 1600 is formed at one of the various stages of fabrication. The metal structure 1600 may include a suitable metal, such as tungsten (W), formed by a suitable method, such as PVD, CVD, electroplating, electroless plating, or the like. Besides tungsten, other suitable material, such as copper (Cu), gold (Au), cobalt (Co), combinations thereof, multi-layers thereof, alloys thereof, or the like, may also be used as the metal structure 1600.

As illustrated in FIG. 16, a metal material (e.g., tungsten) is deposited in the trench 1000 to be in contact with the curved upper surface of the layers 1102, 1104, and 1106 (or of the layer 1106 only) in the lower trench 1000L so as to form the metal structure 1600. In accordance with various embodiments, by overlaying the gate spacers 702/704 with a portion of the gate dielectric layer 1100 (e.g., the first portion 1100A), which includes one or more high-k dielectric materials, it can avoid the gate spacers 702/704 from being attached with the metal material while forming the metal structure 1600. Such an attachment of the metal material is generally referred to as "selective loss." Even though a relatively small amount of the selective loss exists along the gate dielectric layer 1100 in the upper trench 1000U, such a portion of the gate dielectric layer 1100 can be effectively removed by using a wet etching solution that selectively removes a material of the gate dielectric layer 1100 while remaining the metal structure 1600 (and the underlying layers 1102-1104) substantially intact. The wet etching solution will be discussed in further detail below. Moreover, as the respective top surfaces of the spacers 702 are overlaid by the gate dielectric layer 1100 while forming the metal structure 1600, the metal material, which could have been formed on the top surfaces of the spacers 702 (typically knows as "antennas"), can also be minimized. Such antennas can deteriorate the insulation characteristic of a dielectric material to be filled in the gate trench. The dielectric material is typically used to electrically insulate a gate contact from adjacent gate contacts. By minimizing the amount of undesired metal material of the metal structure to be attached to the gate spacers 702/704, when the gate trench 1000 is later filled with such a dielectric material, an insulation characteristic of the dielectric material will not be compromised, thereby improving performance (e.g., reducing leakage current) of the FinFET device 300 as a whole.

Figure 17:
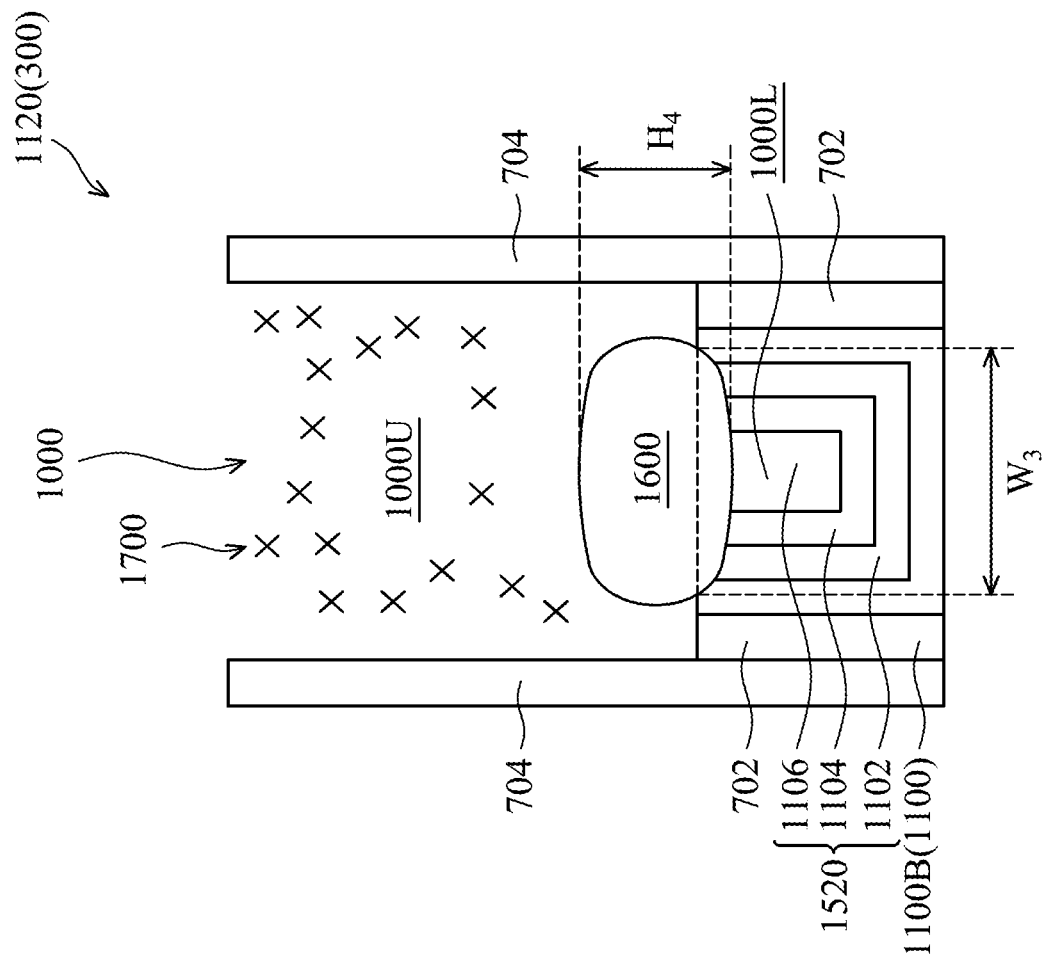

Corresponding to operation 228 of FIG. 2, FIG. 17 is a cross-sectional view of the region 1120 of the FinFET device 300 in which the portion of the gate dielectric layer 1100 (e.g., 1100A shown in FIG. 16) in the upper trench 1000U is removed at one of the various stages of fabrication. The portion of the gate dielectric layer 1100 may be removed by a wet etch process using a wet etching solution 1700 (indicated by Xs in FIG. 17). In an embodiment, the wet etching solution 1700 selectively removes the material of the gate dielectric layer 1100 at a faster rate than the material of the metal structure 1600, thereby allowing the wet etching solution 1700 to effectively remove the gate dielectric layer 1100 in the upper trench 1000U. As such, while the precise components of the wet etching solution 1700 will be dependent at least in part on the materials chosen for the metal structure 1600 and the gate dielectric layer 1100, in an embodiment in which the metal structure 1600 includes tungsten and the gate dielectric layer 1100 includes one or more high-k dielectric materials, the wet etching solution 1700 may include an etchant and an oxidant placed into a solvent. It should be appreciated that the wet etching solution 1700 and corresponding processing conditions, which will be discussed below, may be used on the metal structure 1600 and the gate dielectric layer 1100 that include materials other than the tungsten and the high-k dielectric material, respectively, while remaining within the scope of the present disclosure.

For example, the etchant may be an amine with a formula such as R—$NH_2$, R—N—R', $NR_1R_2R_3$, combinations of these, or the like, wherein each of R, R', $R_1$, $R_2$ and $R_3$ may be an alkyl group, a phenyl group, or the like. In other embodiments the etchant may be an amine such as tetramethylammonium hydroxide (TMAH), ammonium hydroxide ($NH_4OH$), tetrabutylammonium hydroxide (TBAH), combinations of these, or the like. However, any suitable etchant may be utilized.

The oxidant may be used in conjunction with the etchant in order to help control the corrosion potential between the materials of the metal structure 1600 and the gate dielectric layer 1100. In the above example where the metal structure 1600 includes tungsten and the gate dielectric layer 1100 includes one or more high-k dielectric materials, the oxidant may be a fluoride-based acid, for example, hydrofluoric acid (HF), fluoroantimonic acid ($H_2FSbF_6$), etc. In some embodiments, the oxidant may be a mixture of the fluoride-based acid with one or more other acids such as, for example, perchloric acid ($HClO_4$), chloric acid ($HClO_3$), hypochlorous acid (HClO), chlorous acid ($HClO_2$), metaperiodic acid ($HIO_4$), iodic acid ($HIO_3$), iodous acid ($HIO_2$), hypoiodous acid (HIO), perbromic acid ($HBrO_4$), bromic acid ($HBrO_3$), bromous acid ($HBrO_2$), hypobromous acid (HBrO), nitric acid ($HNO_3$), combinations of these, or the like. However, any suitable oxidant may be utilized.

Optionally, if desired, a stabilizer may be added along with the oxidant in order to stabilize the oxidant. In an embodiment the stabilizer may be a chelator such as ethylenediaminetetraacetic acid (EDTA), 1,2-cyclohexanedinitrilotetraacetic acid (CDTA), histidine, diethylenetriamine pentaacetic acid (DTPA), combinations of these, or the like. However, any suitable stabilizer may be utilized.

In an embodiment, the etchant, oxidizer, and stabilizer are all placed within a solvent in order to mix, handle, and eventually deliver the wet etching solution 1700. In an embodiment, the solvent may be an organic solvent such as ethylene glycol (EG), diethylene glycol (DEG), 1-(2-hydroxyethyl)-2-pyrrolidinone (HEP), dimethyl sulfoxide (DMSO), sulfolane, combinations of these, or the like. However, any suitable solvent may be utilized.

In particular embodiments the etchant may be placed within the solvent to a concentration of between about 0.5%-volume and about 15%-volume, such as about 2%-volume. Additionally, the oxidant may be placed into the solvent to a concentration of between about 3%-volume and about 20%-volume, and the stabilizer may be added to a concentration of between about 0.1%-volume and about 5%-volume, such as about 1%-volume. The solvent can make up a remainder of the wet etching solution 1700 and, as such, may have a concentration of between about 5%-volume and about 90%-volume, such as about 60%-volume. However, any suitable concentrations may be utilized.

By utilizing the etchants, oxidants, stabilizers, and solvent described herein, the selectivity of the wet etching solution to the material of the gate dielectric layer 1100 (e.g., the high-k materials) to the metal structure 1600 (e.g., tungsten) can be tuned. In some embodiments, such a selectivity for the wet etching solution 1700 can be chosen between about 4 and about 9, such as about 5. However, any suitable selectivity can be utilized.

The wet etching solution 1700 is placed in contact with both the gate dielectric layer 1100 in the upper trench 1000U (e.g., 1100A shown in FIG. 16) and the metal structure 1600. In an embodiment, the wet etching solution 1700 may be placed using a dip method, a spray on method, a puddle method, combinations of these, or the like. During the etching process, the wet etching solution 1700 may be kept at a temperature of between about 25° C. and about 70° C., such as about 50° C., for a time of between about 1 min and about 10 min, such as about 4 min. However, any suitable process conditions may be utilized.

At the end of the etching process (e.g., at the end of the timed etch), the wet etching solution 1700 is removed and the portion of the gate dielectric layer 1100 has been removed down to the lower trench 1000L. However, because the wet etching solution 1700 is much more selective to the material of the gate dielectric layer 1100, the material of the metal structure 1600 remains substantially intact. As such, the metal structure 1600 remains to extend from the lower trench 1000L to be within the upper trench 1000U. The metal structure 1600 can have a height, $H_4$, which is between the height of the gate spacers 702 and the height of the gate spacers 704. For example, $H_4$ may range between about 5 nm and about 25 nm, such as about 10 nm. Similarly, the metal structure 1600 can have a width, $W_3$, which ranges between about 2 nm and about 10 nm, such as about 4 nm. However, any suitable dimensions may be utilized.

By selectively etching the gate dielectric layer 1100 over the metal structure 1600, the metal structure 1600 remains at the end of the wet etching process. As such, there is less of a chance that the underlying layers (e.g., layers 1102, 1104, and 1106) will be exposed to the wet etching solution 1700, thereby less chance of damage to these underlying layers, which constitute at least a portion of a metal gate. With less potential for damage, there is less chance for defects, thereby increasing the reliability of the process. Further, in some embodiments, the etchants, oxidants, stabilizers, and solvent and the parameters for the etching process, as described herein, may be selected to cause the wet etching solution 1700 to selectively etch the gate dielectric layer 1100 over not only the metal structure 1600 but also the layers 1102, 1104, and 1106.

In some embodiments, the metal structure 1600 forms a gate electrode 1600. As illustrated in FIG. 17, the gate electrode 1600 contacts (e.g., physically contacts) the metal gate 1520. Specifically, in the metal gate 1520, the (remaining) work function layer 1102, and the (remaining) capping layer 1104 each have a U-shaped cross-section. The glue layer 1106 is vertically disposed between the gate electrode 1600 and the capping layer 1104; and horizontally disposed between two opposing inner sidewalls of the U-shaped work function layer 1102, and between two opposing inner sidewalls of the U-shaped gate dielectric layer 1100. The wet etch process etches the second portion 1100B of the gate dielectric layer 1100 with the gate electrode 1600 exposed in the wet etching solution 1700, to leave the gate electrode 1600 substantially intact.

Figure 18:
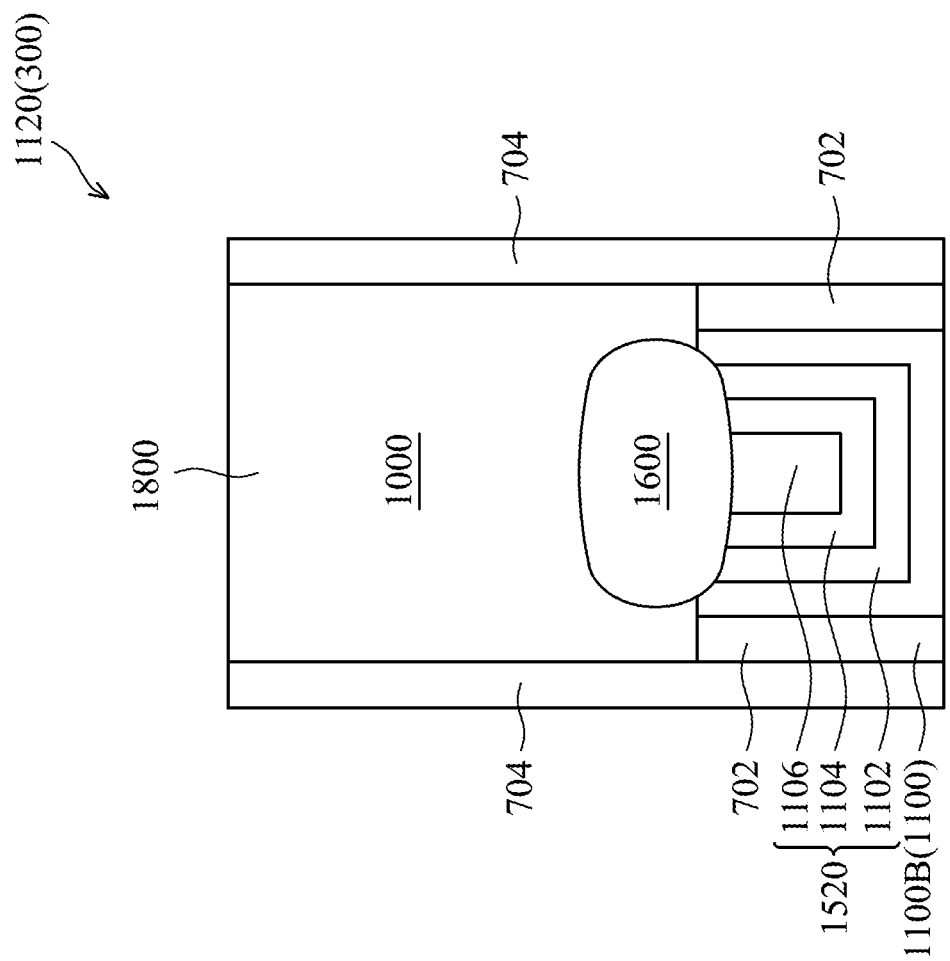

Corresponding to operation 228 of FIG. 2, FIG. 18 is a cross-sectional view of the region 1120 of the FinFET device 300 including a dielectric material 1800 at one of the various stages of fabrication. The dielectric material 1800 (e.g., silicon oxide, silicon nitride, a low-k dielectric material, or the like) is formed in the gate trench 1000, using a suitable formation method such as PVD, CVD, or the like. In some other embodiments, the gate trench 1000 may be first filled with a semiconductor material, such as silicon, and after a gate contact (e.g., 1900 in FIG. 19) is formed, the semiconductor material is replaced with the dielectric material 1800. For example, after a gate contact is formed, the semiconductor material may be removed by an etching process using an etchant that is selective to the semiconductor material. After the semiconductor material is removed, the dielectric material 1800 is formed to fill the space previously occupied by the semiconductor material.

Figure 19:
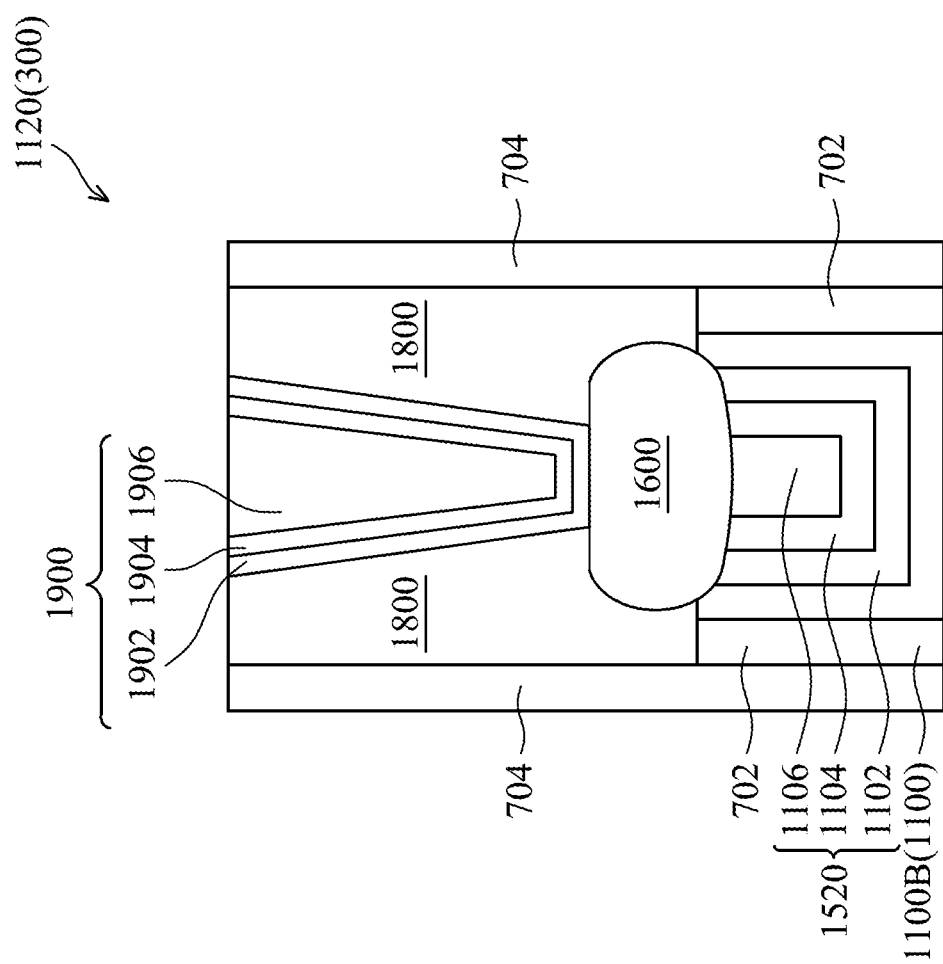

Corresponding to operation 230 of FIG. 2, FIG. 19 is a cross-sectional view of the region 1120 of the FinFET device 300 including a gate contact 1900 at one of the various stages of fabrication. The gate contact 1900 is formed in (e.g., to extend through) the dielectric material 1800 to electrically couple to the gate electrode 1600. In the above example where the dielectric material 1800 is deposited prior to forming the gate contact 1900 (also referred to as contact plugs), a contact opening is formed in the dielectric material 1800 to expose the gate electrode 1600, using, e.g., photolithography and etching. Once the contact opening is formed, a barrier layer 1902, a seed layer 1904, and a fill metal 1906 are formed successively in the contact opening to form the gate contact 1900.

The barrier layer 1902 includes an electrically conductive material such as titanium nitride, although other materials, such as tantalum nitride, titanium, tantalum, or the like, may alternatively be utilized. The barrier layer 1902 may be formed using a CVD process, such as PECVD. However, other alternative processes, such as sputtering, metal organic chemical vapor deposition (MOCVD), or ALD, may alternatively be used.

The seed layer 1904 is formed over the barrier layer 1902. The seed layer 1904 may include copper, titanium, tantalum, titanium nitride, tantalum nitride, the like, or a combination thereof, and may be deposited by ALD, sputtering, PVD, or the like. In some embodiments, the seed layer 1904 is a metal layer, which may be a single layer or a composite layer comprising a plurality of sub-layers formed of different materials. For example, the seed layer 1904 may include a titanium layer and a copper layer over the titanium layer.

The fill metal 1906 is deposited over the seed layer 1904, and fills the remaining portions of the contact opening. The fill metal 1906 may be a metal-containing material such as copper (Cu), aluminum (Al), tungsten (W), the like, combinations thereof, or multi-layers thereof, and may be formed by, e.g., electroplating, electroless plating, or other suitable method. After the formation of the fill metal 1906, a planarization process, such as a CMP, may be performed to remove the excess portions of the barrier layer 1902, the seed layer 1904, and the fill metal 1906, which excess portions are over the upper surface of the dielectric layer 904 (referring again to FIG. 11) and over the upper surface of the second gate spacer 704. The resulting remaining portions of the barrier layer 1902, the seed layer 1904, and the fill metal 1906 thus form the gate contact 1900.

Figure 20:
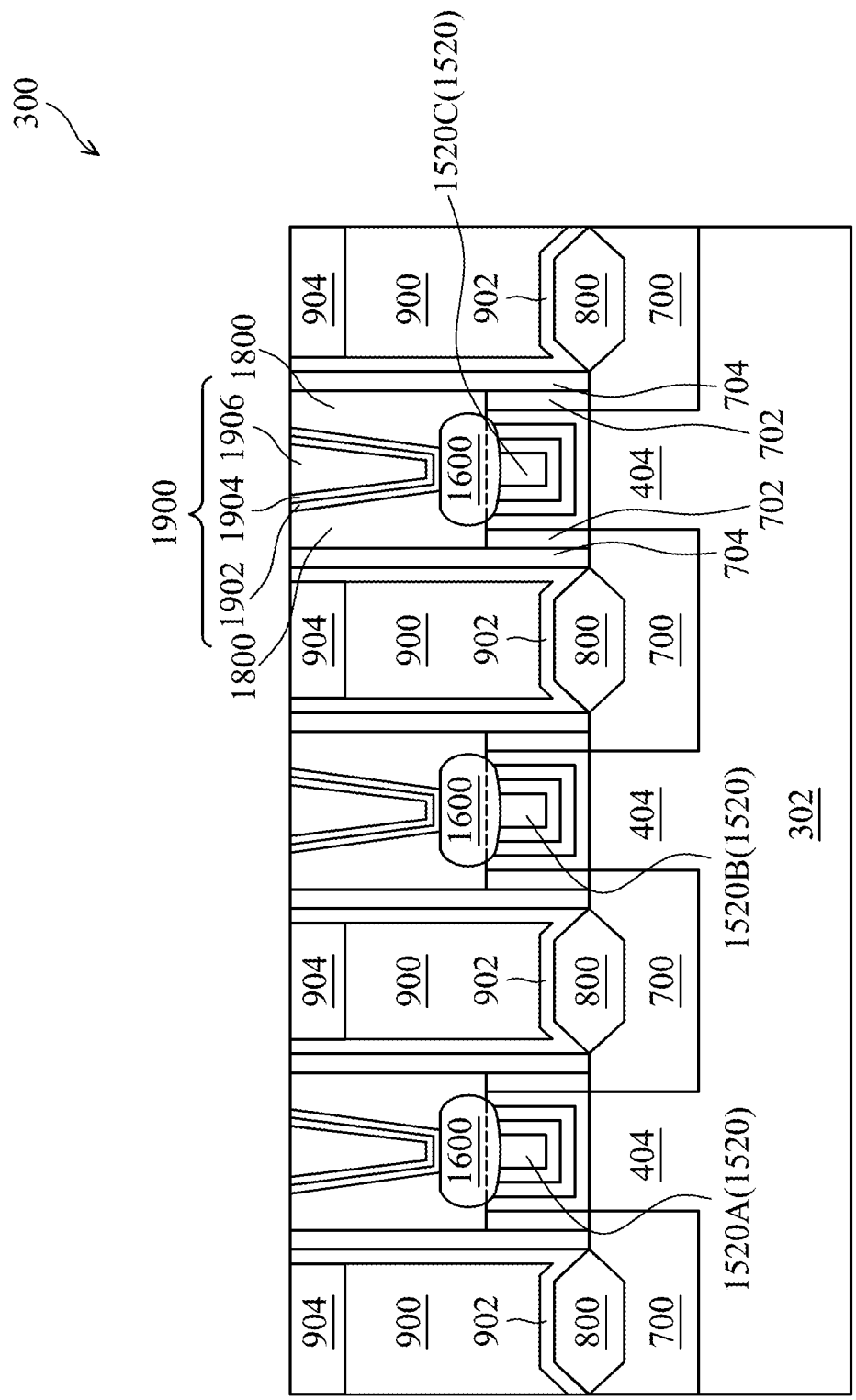

FIG. 20 shows the cross-sectional view of the FinFET device 300 after the gate contact(s) 1900, electrically coupling to the respective metal gates 1702, are formed. As shown, metal gates 1520A, 1520B, and 1520C, which replaced respective portions of the dummy gate structure 600A, 600B, and 600C (FIG. 9), respectively, are formed over the fin 404. The metal gates 1520A-C may sometimes be collectively referred to as "metal gates 1520." It should be appreciated that additional processing may be performed to finish the fabrication of the FinFET device 300, such as forming source/drain contacts and forming metallization layers over the dielectric layer 904. For brevity, details with respect to those structures are not discussed herein.

As semiconductor manufacturing process continues to advance, the distance (e.g., pitch) between adjacent metal gates 1520 are getting closer and closer. For advanced processing nodes such as 5 nm or beyond, the small pitch between metal gates 1520 may cause metal gate leakage, which decreases the reliability of the device formed. By protecting the gate spacers 702/704 with the gate dielectric layer 1100 while forming the gate electrode 1600, the amount of undesired metal material (of the gate electrode 1600) to be attached to the gate spacers 702/704 can be reduced or eliminated. Accordingly, deterioration or damage to the insulation characteristic of the dielectric material 1800 can be minimized, thereby helping to increase the reliability of the device formed.

In the example of FIG. 20, the illustrated metal gates 1520 have a same structure (e.g., same film scheme in the metal gates). In other embodiments, the metal gates 1520 may have respective different structures. For example, each of the metal gates 1520 may have different work function layer(s) to achieve different threshold voltages, and/or to form metal gates in different regions (e.g. N-type device region or P-type device region) of the FinFET device 300. An example is illustrated in FIG. 21.

Figure 21:
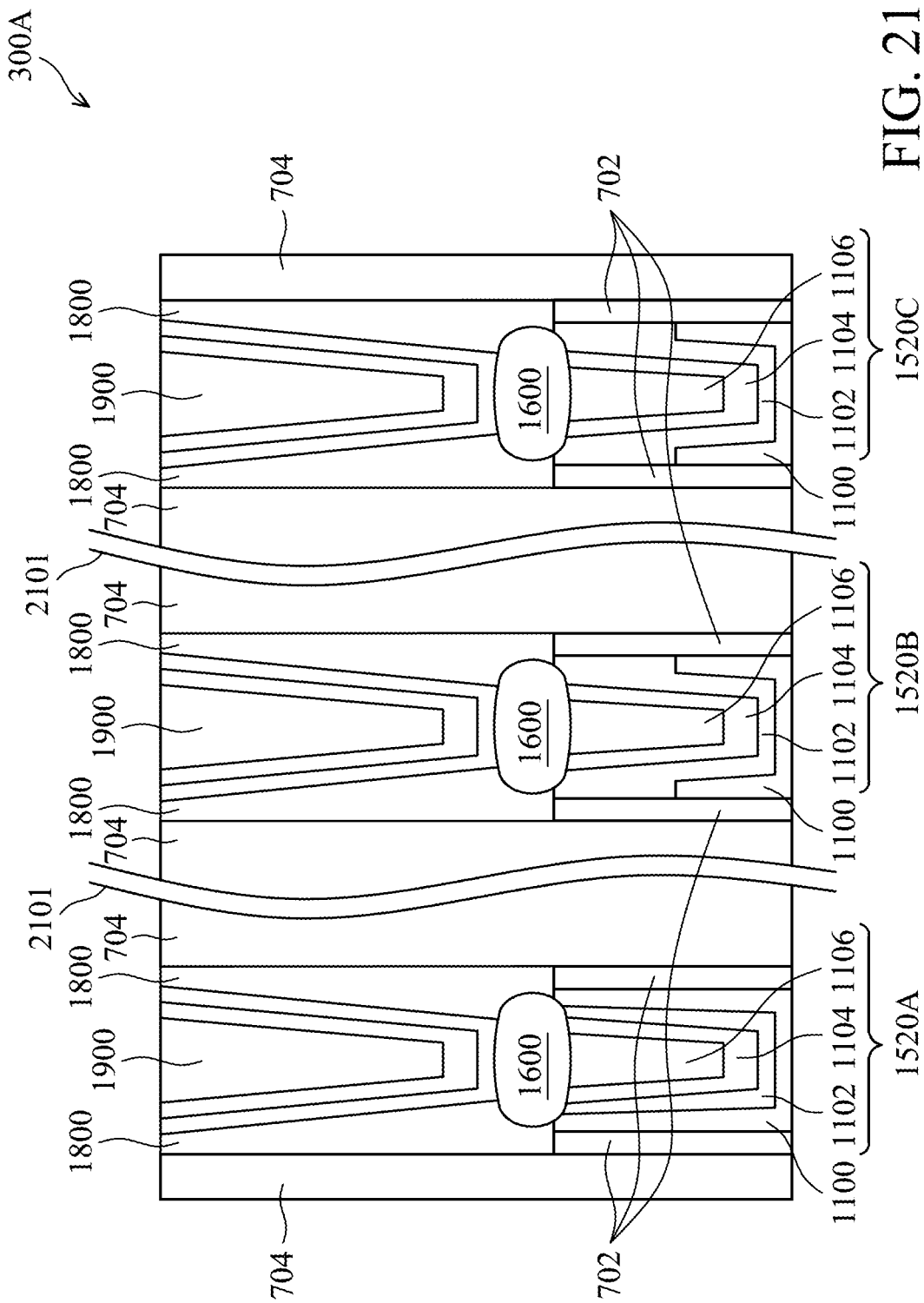
FIG. 21 illustrates a cross-sectional view of another example FinFET device, in accordance with some embodiments.

Referring to FIG. 21, a cross-sectional view of portions of a FinFET device 300A is shown. The FinFET device 300A is substantially similar to the FinFET device 300 shown in FIG. 20, but with different work function layer(s) for each metal gate. For simplicity, FIG. 21 only illustrates portions of the FinFET device 300A adjacent to the metal gates 1520A, 1520B, and 1520C. The metal gates 1520A, 1520B, and 1520C are separated by dividers 2101, where the dividers 2101 include additional features (see, e.g., FIG. 20) between the metal gates 1520A, 1520B, and 1520C that are omitted for simplicity.

As shown, the metal gate 1520A is the same as the metal gate 1520A in FIG. 20, which includes an N-type work function layer 1102. The metal gate 1520B of FIG. 21, however, includes two work function layers. For example, the metal gate 1520B includes a P-type work function layer 2100 contacting (e.g., physically contacting) and extending along the gate dielectric layer 1100, and includes the same N-type work function layer 1102 contacting (e.g., physically contacting) and extending along the P-type work function layer 2100 and a portion of the gate dielectric layer 1100. Note that while the N-type work function layer 1102 of the metal gate 1520A has a U-shaped cross-section, the N-type work function layer 1102 of the metal gate 1520B has laterally extended portion connected to the ends of the U-shaped cross-section, respectively, which may due to the dual-work function layer structure of the metal gate 1520B having less space available for the N-type work function layer 1102. The metal gate 1520C of FIG. 21 is similar to the metal gate 1520B of FIG. 20, but with a different P-type work function layer 2102.

The present disclosure provides many advantages for forming FinFET devices having the metal gates 1520 with different film schemes (e.g., different work function layers). Here the term film scheme refers to the materials and the structure of the stack of layers (e.g., 1100, 1102, 1102 and 2100, 1102 and 2102, 1104, and 1106) of the metal gates 1520. Due to the different film schemes (e.g., different work function layers) of the metal gates in the gate trenches 1000A-C, the etch rates for the different combinations of layers in the gate trenches are different, which results in a loading effect (e.g., non-uniformity) in the removal of the layers in the gate trenches. In other words, the amount of removed layers in the gate trenches are different. This may result in the gate heights of the subsequently formed metal gates 1520A-C to be non-uniform. As such, the different film schemes of the different metal gates 1520A-C may have different heights. The presently disclosed method helps to protect the underlying structures by forming the gate electrode 1600 over the metal gates 1520 prior to selectively etching the portion of the gate dielectric layer 1100 not overlaid by the gate electrode 1600. In this way, more of the material of the gate electrode 1600 remains intact during the selective etching process, helping to prevent unintended over-etches that damage the underlying layers. As such, damage to the metal gates 1520 is avoided and the critical dimension of the metal gates 1520 can be preserved.

Figure 22:
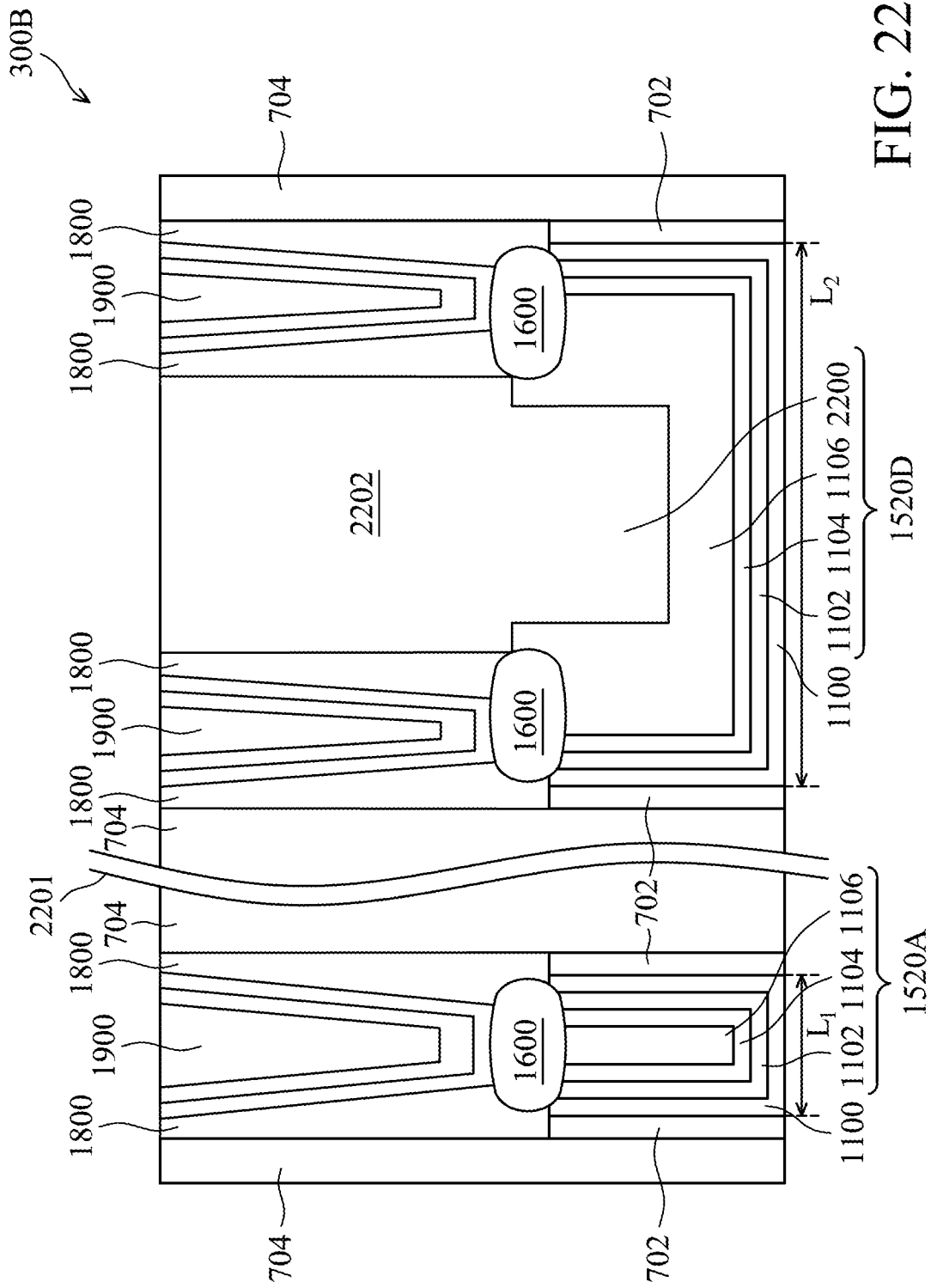
FIG. 22 illustrates a cross-sectional view of yet another example FinFET device, in accordance with some embodiments.

Referring to FIG. 22, a cross-sectional view of portions of a FinFET device 300B is shown. The FinFET device 300B is substantially similar to the FinFET device 300 shown in FIG. 20, but with an additional metal gate 1520D. For simplicity, FIG. 22 only illustrates portions of the FinFET device 300B adjacent to the metal gates 1520A and 1520D. The metal gates 1520A and 1520D are separated by a divider 2201, where the divider 2201 includes additional features (see, e.g., FIG. 20) such as, the metal gate 1520B and 1520C that are omitted for simplicity.

As shown, the metal gate 1520A is the same as the metal gate 1520A in FIG. 20, which, together with a corresponding gate dielectric layer 1100, extend over a distance that defines a channel length, $L_1$, of a corresponding transistor. The metal gate 1520D, together with a corresponding gate dielectric layer 1100, however, extend over a distance that defines a channel length, $L_2$, which is substantially greater than $L_1$. Such a transistor with the relatively short channel length (e.g., the transistor having the metal gate 1520A) may sometimes be referred to as a short-channel transistor; and such a transistor with the relatively long channel length (e.g., the transistor having the metal gate 1520D) may sometimes be referred to as a long-channel transistor. In the example of the long-channel transistor, the metal gate 1520D may further include a metal fill 2200 (e.g., tungsten) and a dielectric fill 2202 (e.g., silicon oxide, silicon nitride, a low-k dielectric material, or the like). Partially due to the relatively long channel length, each of the layers 1100, 1102, 1104, and 1106 of the metal gate 1520D may have a U-shaped cross-section, and the metal fill 2200, which may also have a U-shaped cross-section, contacts (e.g., physically contacts) the glue layer 1106. Further, the metal gate 1520D can include an additional gate electrode 1600. Each of the gate electrodes 1600 electrically couples to one of the ends of a combination of the U-shaped layers 1102, 1104, and 1106 and the U-shaped metal fill 2200. Accordingly, one or more gate contacts 1900 may be formed to couple the gate electrodes 1600.

In one aspect of the present disclosure, a method of manufacturing a semiconductor device is disclosed. The method includes forming a gate trench over a semiconductor fin. The gate trench includes an upper portion surrounded by first gate spacers and a lower portion surrounded by second gate spacers and the first gate spacers. The method includes forming a metal gate in the lower portion of the gate trench. The metal gate is disposed over a first portion of a gate dielectric layer. The method includes depositing a metal material in the gate trench to form a gate electrode overlaying the metal gate in the lower portion of the gate trench, while keeping sidewalls of the first gate spacers and upper surfaces of the second gate spacer overlaid by a second portion of the gate dielectric layer. The method includes removing the second portion of the gate dielectric layer, while remaining the gate electrode substantially intact.

In another aspect of the present disclosure, a method of manufacturing a semiconductor device is disclosed. The method includes removing a dummy gate structure that overlays a portion of a semiconductor fin. The method includes forming a metal gate over the portion of the semiconductor fin, the metal gate including a first portion of a gate dielectric layer. The method includes depositing a metal material to form a gate electrode contacting the metal gate, while exposing a second portion of the gate dielectric layer. The method includes etching the second portion of the gate dielectric layer with the gate electrode exposed during the etching. The gate electrode remains substantially intact.

In yet another aspect of the present disclosure, a semiconductor device is disclosed. The semiconductor device includes a semiconductor fin. The semiconductor device includes first spacers over the semiconductor fin. The semiconductor device includes second spacers over the semiconductor fin, the second spacers extending farther from the semiconductor fin than the first spacers. The semiconductor device includes a metal gate, over the semiconductor fin, that is sandwiched by the first spacers, which are further sandwiched by the second spacers. The semiconductor device includes a gate electrode contacting an upper surface of the metal gate, wherein the gate electrode does not extend over the first spacers or the second spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor fin;
   a metal gate disposed over the semiconductor fin;
   a gate dielectric layer disposed between the semiconductor fin and the metal gate;
   first spacers sandwiching the metal gate, wherein the first spacers have a first top surface and the gate dielectric layer has a second top surface, and wherein the first top surface and a first portion of the second top surface are coplanar with each other;
   second spacers further sandwiching the first spacers, wherein the second spacers have a third top surface above the first top surface and the second top surface; and
   a gate electrode disposed over the metal gate, the gate electrode having a fourth top surface above the first portion of the second top surface and a bottom surface below the first portion of the second top surface.

2. The semiconductor device of claim 1, wherein the metal gate further comprises:
   a work function layer;
   an optional capping layer; and
   a glue layer.

3. The semiconductor device of claim 2, wherein the gate electrode is in contact with a top surface of each of the work function layer, the optional capping layer, and the glue layer.

4. The semiconductor device of claim 3, wherein the top surfaces of the work function layer, the optional capping layer, and the glue layer collectively form a curved surface recessed with respect to the first portion of the second top surface and the first top surface that are coplanar with each other.

5. The semiconductor device of claim 4, wherein the gate electrode is also in contact with a second portion of the second top surface.

6. The semiconductor device of claim 4, wherein a vertical distance between a lowest position of the collectively formed curved surface and the first top surface is in a range of about 3 nanometers (nm) to about 12 nm.

7. The semiconductor device of claim 5, wherein the second portion of the second top surface is a part of the collectively formed curved surface.

8. The semiconductor device of claim 1, wherein the gate electrode essentially consists of tungsten.

9. The semiconductor device of claim 1, wherein the gate dielectric layer comprises one or more high-k dielectric materials.

10. The semiconductor device of claim 1, wherein the gate electrode is not in contact with the first spacers or the second spacers.

11. A semiconductor device, comprising:
a semiconductor fin;
a metal gate disposed over the semiconductor fin;
a gate dielectric layer lining a portion of the metal gate;
first spacers sandwiching the metal gate, wherein the first spacers have a first top surface and the gate dielectric layer has a second top surface, at least a first portion of the second top surface being coplanar with the first top surface;
second spacers further sandwiching the first spacers, wherein the second spacers have a third top surface above the first top surface and the second top surface; and
a gate electrode in direct contact with a fourth top surface of the metal gate and with a second portion of the second top surface below the first portion.

12. The semiconductor device of claim 11, wherein the gate dielectric layer comprises at least one high-k dielectric material.

13. The semiconductor device of claim 11, wherein the gate electrode does not extend over the first spacers or the second spacers.

14. The semiconductor device of claim 11, wherein the fourth top surface has a curved profile.

15. The semiconductor device of claim 14, a vertical distance between a lowest position of the fourth top surface and the first top surface is in a range of about 3 nanometers (nm) to about 12 nm.

16. The semiconductor device of claim 11, wherein the metal gate further comprises:
a work function layer;
an optional capping layer; and
a glue layer.

17. The semiconductor device of claim 16, wherein each of the work function layer, the optional capping layer, the glue layer, and the gate dielectric layer has a U-shaped profile.

18. A semiconductor device, comprising:
a semiconductor fin;
a metal gate disposed over the semiconductor fin;
first spacers sandwiching the metal gate;
second spacers further sandwiching the first spacers, wherein the second spacers extend farther from the semiconductor fin than the first spacers do; and
a first gate electrode and a second gate electrode contacting a top surface of the metal gate, wherein neither the first spacers nor the second spacers are in contact with any of the first gate electrode and the second gate electrode, and wherein the first gate electrode and the second gate electrode are laterally separated from one another along a length of a channel underlying the metal gate.

19. The semiconductor device of claim 18, further comprising a gate dielectric layer disposed between the metal gate and the semiconductor fin, and between the metal gate and the first spacers, wherein the gate dielectric layer has a top surface that is partially coplanar with a top surface of the first spacers.

20. The semiconductor device of claim 18, wherein each of the first gate electrode and the second gate electrode essentially consists of tungsten.

* * * * *